US012232387B2

(12) United States Patent
Moon et al.

(10) Patent No.: US 12,232,387 B2
(45) Date of Patent: Feb. 18, 2025

(54) DISPLAY APPARATUS INCLUDING LAYER WITH A PLURALITY OF PARTS HAVING DIFFERENT ELECTRICAL CONDUCTIVITIES ON EMISSION LAYERS

(71) Applicant: Samsung Display Co., Ltd., Yongin-si (KR)

(72) Inventors: Jaesuk Moon, Yongin-si (KR); Euigyu Kim, Yongin-si (KR); Sangmin Yi, Yongin-si (KR); Sangshin Lee, Yongin-si (KR); Seungjin Lee, Yongin-si (KR); Seungju Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 102 days.

(21) Appl. No.: 17/454,982

(22) Filed: Nov. 15, 2021

(65) Prior Publication Data

US 2022/0238608 A1    Jul. 28, 2022

(30) Foreign Application Priority Data

Jan. 28, 2021    (KR) .................. 10-2021-0012650

(51) Int. Cl.
*H10K 59/35* (2023.01)
*H10K 50/15* (2023.01)
(Continued)

(52) U.S. Cl.
CPC ............ *H10K 59/35* (2023.02); *H10K 50/15* (2023.02); *H10K 50/16* (2023.02); *H10K 50/17* (2023.02);
(Continued)

(58) Field of Classification Search
None
See application file for complete search history.

(56) References Cited

U.S. PATENT DOCUMENTS 6,602,790 B2    8/2003  Kian et al.
6,784,032 B2    8/2004  Lee et al.
(Continued)

FOREIGN PATENT DOCUMENTS

KR    10-2005-0060294 A    6/2005
KR    10-2009-0003601 A    1/2009
(Continued)

OTHER PUBLICATIONS

EPO Extended European Search Report dated Nov. 28, 2022, issued in corresponding European Patent Application No. 22153622.0 (13 pages).

*Primary Examiner* — Daniel Whalen
(74) *Attorney, Agent, or Firm* — Lewis Roca Rothgerber Christie LLP

(57) ABSTRACT

A display apparatus includes: a first pixel electrode of a first pixel; a second pixel electrode of a second pixel adjacent to the first pixel, the first and second pixels to emit light of different colors from each other; a first lower emission layer on the first pixel electrode; a second lower emission layer on the second pixel electrode; a first upper emission layer on the first lower emission layer; a second upper emission layer on the second lower emission layer; a charge generation layer between the first lower emission layer and the first upper emission layer, and between the second lower emission layer and the second upper emission layer; and a counter electrode extending across the first upper emission layer and the second upper emission layer. The charge generation layer includes first and second parts, and electrical conductivities of the first and second parts are different from each other.

9 Claims, 19 Drawing Sheets

(51) Int. Cl.
  *H10K 50/16*   (2023.01)
  *H10K 50/17*   (2023.01)
  *H10K 50/19*   (2023.01)
  *H10K 59/38*   (2023.01)
  *H10K 71/00*   (2023.01)
  *H10K 59/122*  (2023.01)
  *H10K 102/00*  (2023.01)

(52) U.S. Cl.
  CPC ........... *H10K 50/171* (2023.02); *H10K 50/19* (2023.02); *H10K 59/38* (2023.02); *H10K 71/00* (2023.02); *H10K 59/122* (2023.02); *H10K 59/351* (2023.02); *H10K 2102/331* (2023.02)

(56) References Cited

U.S. PATENT DOCUMENTS

| | | |
|---|---|---|
| 6,949,389 B2 | 9/2005 | Pichler et al. |
| 9,502,475 B2 | 11/2016 | Lee |
| 10,411,079 B2 | 9/2019 | Cho et al. |
| 2014/0167018 A1 | 6/2014 | Okumoto et al. |
| 2015/0069361 A1 | 3/2015 | Sato et al. |
| 2015/0076461 A1 | 3/2015 | Shitagaki et al. |
| 2015/0144926 A1* | 5/2015 | Lee ............ H10K 50/131 257/40 |
| 2015/0155519 A1* | 6/2015 | Lee ............ H10K 59/32 257/40 |
| 2016/0380035 A1* | 12/2016 | Cho ............ H10K 50/17 257/40 |

FOREIGN PATENT DOCUMENTS

| | | |
|---|---|---|
| KR | 10-2012-0109408 A | 10/2012 |
| KR | 10-1236235 B1 | 2/2013 |
| KR | 10-2015-0062759 A | 6/2015 |
| KR | 10-2017-0001099 A | 1/2017 |
| KR | 10-1950838 B1 | 2/2019 |

\* cited by examiner

DISPLAY APPARATUS INCLUDING LAYER WITH A PLURALITY OF PARTS HAVING DIFFERENT ELECTRICAL CONDUCTIVITIES ON EMISSION LAYERS

CROSS-REFERENCE TO RELATED APPLICATION

This application claims priority to and the benefit of Korean Patent Application No. 10-2021-0012650, filed on Jan. 28, 2021, in the Korean Intellectual Property Office, the entire contents of which are hereby incorporated by reference.

BACKGROUND

1. Field

One or more embodiments relate to display apparatuses, masks for manufacturing the display apparatuses, and methods of manufacturing the display apparatuses. More particularly, one or more embodiments relate to display apparatuses with improved display quality by preventing or reducing light emission by a leakage current, masks for manufacturing the display apparatuses, and methods of manufacturing the display apparatuses.

2. Description of the Related Art

Among display apparatuses, an organic light-emitting display apparatus having merits of a wide viewing angle, an excellent contrast, and a fast response speed is highlighted as a next generation display apparatus.

Generally, in an organic light-emitting display apparatus, thin film transistors and organic light-emitting devices are formed on a substrate, and the organic light-emitting devices operate by emitting light by themselves. The organic light-emitting display apparatus may be used as a display portion of a compact product, for example, such as a mobile phone and the like, or may be used as a display portion of a large product, for example, such as a television and the like.

The organic light-emitting display apparatus may include, as each (sub-) pixel, an organic light-emitting device in which an intermediate layer including an emission layer is provided between a pixel electrode and a counter electrode. The organic light-emitting display apparatus may generally control the light-emitting or a degree of light-emitting of each pixel through a thin film transistor electrically connected to the pixel electrode, and the counter electrode may be formed as one body with respect to a plurality of (sub-) pixels.

The above information disclosed in this Background section is for enhancement of understanding of the background of the present disclosure, and therefore, it may contain information that does not constitute prior art.

SUMMARY

In a display apparatus according to a comparative example, a non-light-emitting pixel that is disposed around a light-emitting pixel may emit light together with the light-emitting pixel due to a leakage current between adjacent pixels, and thus, display quality may deteriorate.

One or more embodiments are directed to display apparatuses with improved display quality by preventing or reducing a leakage current, masks for manufacturing the display apparatuses, and methods of manufacturing the display apparatuses. However, as the embodiments described in the present disclosure are provided as examples, other aspects, features, and modifications may be realized from the presented embodiments of the present disclosure.

Additional aspects and features will be set forth, in part, in the description that follows, and in part, will be apparent from the description, or may be learned by practicing one or more of the presented embodiments of the present disclosure.

According to one or more embodiments of the present disclosure, a display apparatus includes: a first pixel electrode of a first pixel; a second pixel electrode of a second pixel adjacent to the first pixel, the first and second pixels configured to emit light of different colors from each other; a first lower emission layer on the first pixel electrode; a second lower emission layer on the second pixel electrode; a first upper emission layer on the first lower emission layer; a second upper emission layer on the second lower emission layer; a charge generation layer between the first lower emission layer and the first upper emission layer, and between the second lower emission layer and the second upper emission layer; and a counter electrode extending across the first upper emission layer and the second upper emission layer, The charge generation layer includes a first part corresponding to each of the first pixel electrode and the second pixel electrode, and a second part corresponding to an area between the first pixel electrode and the second pixel electrode, and electrical conductivities of the first part and the second part are different from each other.

In an embodiment, the electrical conductivity of the second part may be less than the electrical conductivity of the first part.

In an embodiment, the electrical conductivity of the first part may be about ten times or more greater than the electrical conductivity of the second part.

In an embodiment, light emitted from between the first pixel electrode and the counter electrode may have a first wavelength band, and light emitted from between the second pixel electrode and the counter electrode may have a second wavelength band different from the first wavelength band.

In an embodiment, the first lower emission layer and the first upper emission layer may be configured to emit light of the same wavelength band as each other.

In an embodiment, the first lower emission layer and the first upper emission layer may be configured to emit light of different wavelength bands from each other.

In an embodiment, the second lower emission layer and the second upper emission layer may be configured to emit light of the same wavelength band as each other.

In an embodiment, the second lower emission layer and the second upper emission layer may be configured to emit light of different wavelength bands from each other.

According to one or more embodiments of the present disclosure, a display apparatus includes: a first pixel; a second pixel adjacent to the first pixel, and configured to emit light of a different color from that of the first pixel; a first organic light-emitting diode corresponding to the first pixel; a second organic light-emitting diode corresponding to the second pixel; a first emission layer in the first organic light-emitting diode; a second emission layer in the second organic light-emitting diode; and a common layer commonly extending across the first organic light-emitting diode and the second organic light-emitting diode. The common layer includes a first part corresponding to the first emission layer and the second emission layer, and a second part corresponding to an area between the first emission layer and the second emission layer, and an electrical conductivity of the second part is less than an electrical conductivity of the first part.

According to one or more embodiments of the present disclosure, a method of manufacturing a display apparatus, includes: forming a first pixel electrode and a second pixel electrode on a substrate, the first and second pixel electrodes being adjacent to each other; forming a first lower emission layer on the first pixel electrode; forming a second lower emission layer on the second pixel electrode; forming a charge generation layer across the first lower emission layer and the second lower emission layer; forming a first upper emission layer and a second upper emission layer on the charge generation layer; forming a counter electrode across the first upper emission layer and the second upper emission layer; and irradiating light to a part of the charge generation layer corresponding to an area between the first pixel electrode and the second pixel electrode.

In an embodiment, the charge generation layer may include: a first part corresponding to each of the first pixel electrode and the second pixel electrode; and a second part corresponding to the area between the first pixel electrode and the second pixel electrode. The irradiating of the light to the part of the charge generation layer may include irradiating the light to the second part and not the first part.

In an embodiment, the irradiating of the light to the part of the charge generation layer may include irradiating the light to the second part of the charge generation layer by using a photomask.

In an embodiment, the second part of the charge generation layer may be degraded by the light irradiated thereto, and the electrical conductivity of the second part may be less than the electrical conductivity of the first part.

In an embodiment, the light irradiated to the part of the charge generation layer may be in an ultraviolet range.

According to one or more embodiments of the present disclosure, a photomask for manufacturing a display apparatus, includes: a frame portion having an opening at a center thereof; a rib portion extending across the opening of the frame portion, and having a plurality of transmission windows, the rib portion comprising one side in contact with the frame portion, and another side in contact with the frame portion; and an organic film portion on one surface of the rib portion to at least partially overlap with the rib portion corresponding to the plurality of transmission windows.

In an embodiment, the organic film portion may include a flexible material.

In an embodiment, the organic film portion may include a first area configured to not transmit light, and a second area configured to transmit light.

In an embodiment, the first area may correspond to a light-emitting area of each of a plurality of pixels of the display apparatus, and the second area may correspond to a non-light-emitting area between the plurality of pixels.

In an embodiment, the organic film portion may include a film sheet, and a light shielding layer on the film sheet corresponding to the first area, the light shielding layer including a light shield material.

In an embodiment, the frame portion may include a metal material, and a thickness of the frame portion may be greater than thicknesses of the rib portion and the organic film portion.

These and other aspects and features of the present disclosure will become more apparent from the detailed description, drawings, and claims and their equivalents.

These general and specific embodiments may be implemented by using a system, a method, a computer program, or a combination thereof.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
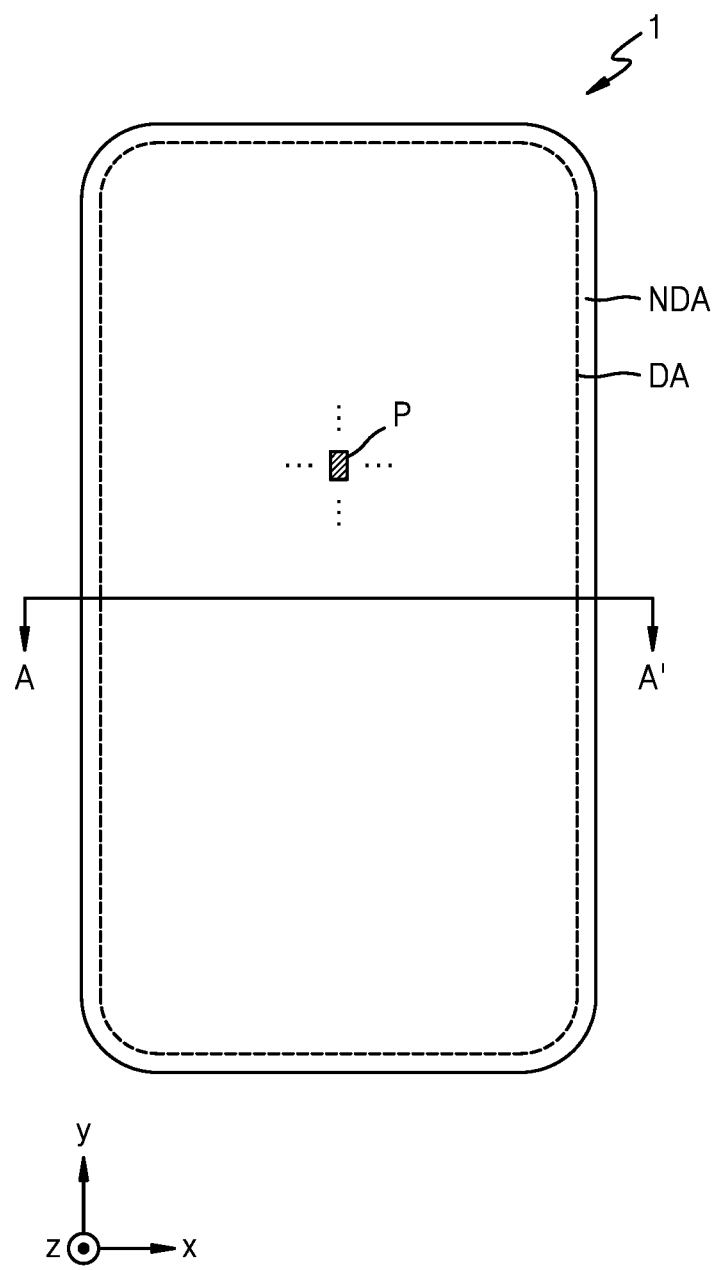
FIG. 1 is a schematic plan view of a portion of a display apparatus according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element, layer, region, area, or component is referred to as being "on," "connected to," or "coupled to" another element, layer, region, area, or component, it can be directly on, connected to, or coupled to the other element, layer, region, area, or component, or one or more elements, layers, regions, areas, or components may be present. Similarly, when an element, layer, region, area, or component is referred to as being "formed on" another element, layer, region, area, or component, it can be directly or indirectly formed on the other element, layer, region, area, or component. Moreover, when an element, layer, region, area, or component is referred to as being "electrically connected" to another element, layer, region, area, or component, it may be directly electrically connected to the other element, layer, region, area, or component and/or may be indirectly electrically connected with one or more intervening elements, layers, regions, areas, or components. In addition, it will also be understood that when an element, layer, region, area, or component is referred to as being "between" two elements, layers, regions, areas, or components, it can be the only element, layer, region, area, or component between the two elements, layers, regions, areas, or components, or one or more intervening elements, layers, regions, areas, or components may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic plan view of a portion of a display apparatus 1 according to an embodiment.

Referring to FIG. 1, the display apparatus 1 may include a display area DA, and a peripheral area NDA outside the display area DA. A plurality of pixels P, each including a display element, may be arranged at (e.g., in or on) the display area DA, and the display apparatus 1 may provide an image by using light emitted from an array of the pixels P arranged two-dimensionally at (e.g., in or on) the display area DA. The peripheral area NDA may be a kind of a non-display area where no display element is disposed. The display area DA may be entirely or partially surrounded (e.g., around a periphery thereof) by the peripheral area NDA.

Although FIG. 1 illustrates that the display apparatus 1 includes a flat or substantially flat display surface, the present disclosure is not limited thereto. In another embodiment, the display apparatus 1 may include a three-dimensional display surface, or a curved display surface.

When the display apparatus 1 includes a three-dimensional display surface, the display apparatus 1 may include a plurality of display areas indicating directions that are different from each other, for example, such as a polygonal column type display surface. In another embodiment, when the display apparatus 1 includes a curved display surface, the display apparatus 1 may be implemented in or operated in various suitable shapes or states, for example, such as a flexible display apparatus, a foldable display apparatus, a rollable display apparatus, and/or the like.

Furthermore, FIG. 1 illustrates that the display apparatus 1 may be applied to a cell phone terminal according to an embodiment, but the present disclosure is not limited thereto. In the case of the cell phone terminal, various electronic modules (e.g., various electronic devices), a camera module (e.g., a camera), a power module (e.g., a power supply), and/or the like, which may be mounted on a mainboard, may be further arranged with (e.g., in or on) the display apparatus 1 in a bracket/case and the like, to configured the cell phone terminal. However, the cell phone terminal shown in FIG. 1 is provided as an example, and the display apparatus 1 according to one or more embodiments may be applied to large electronic devices, for example, such as televisions, monitors, and the like, small and medium-sized electronic devices, for example, such as tablets, automobile navigation devices, game consoles, smart watches, and the like.

Although FIG. 1 illustrates that the display area DA of the display apparatus 1 may have a rectangular shape with rounded corners (e.g., in a plan view, or in other words, in a view from a direction that is perpendicular to or substantially perpendicular to a front surface or a top surface of the relevant member), the present disclosure is not limited thereto. In other embodiments, the shape (e.g., in a plan view) of the display area DA may be circular, oval, or polygonal, for example, such as triangular, pentagonal, and/or the like.

Hereinafter, an example of the display apparatus 1 according to an embodiment will be described in more detail as an organic light-emitting display apparatus, but the present disclosure is not limited thereto. In other embodiments, the display apparatus 1 may include an inorganic light-emitting display, an inorganic electroluminescent (EL) display, or a quantum-dot light-emitting display. For example, an emission layer of a display element in the display apparatus 1 may include an organic material, an inorganic material, a quantum dot, both an organic material and a quantum dot, both an inorganic material and a quantum dot, and/or the like.

Figure 2:
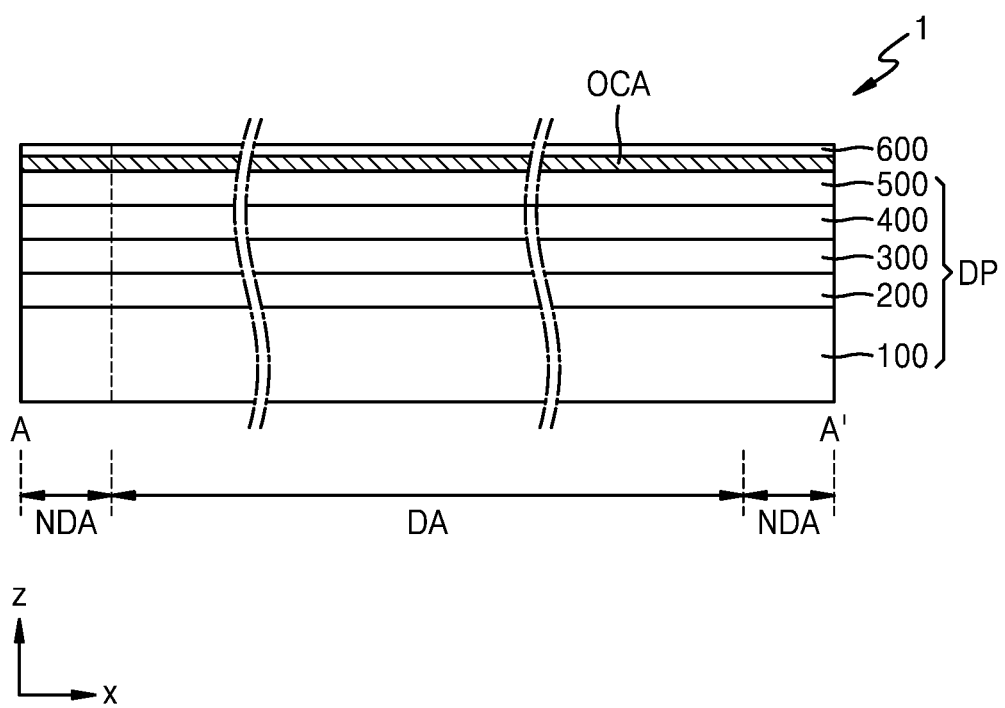
FIG. 2 is a schematic cross-sectional view of the display apparatus taken along the line A-A' of FIG. 1.

FIG. 2 is a schematic cross-sectional view of the display apparatus 1 taken along the line A-A' of FIG. 1.

Referring to FIG. 2, the display apparatus 1 according to an embodiment may include a substrate 100, a display layer 200, a thin film encapsulation layer 300, an input sensing layer 400, an antireflective layer 500, and a window layer 600. At least some of the display layer 200, the input sensing layer 400, the antireflective layer 500 and the window layer 600, which are disposed on the substrate 100, may be formed in a continuous process, or may be connected to (e.g., coupled to or attached to) each other through an adhesive member. In FIG. 2, an optically clear adhesive member (OCA) is illustrated as an example of the adhesive member. The adhesive member described in more detail below may include a common adhesive or a pressure-sensitive adhesive. In an embodiment, the antireflective layer 500 and/or the window layer 600 may be substituted with another suitable element, or may be omitted.

The display layer 200 may include the pixels P as described with reference to and shown in FIG. 1. The thin film encapsulation layer 300 may be provided to hermetically seal a display element, for example, such as an organic light-emitting diode (OLED) of FIG. 3, of each of the pixels P. The thin film encapsulation layer 300 may include at least one inorganic encapsulation layer and/or at least one organic encapsulation layer.

The display layer 200 may generate an image, and the input sensing layer 400 may obtain coordinate information of an external input, for example, such as a touch event. In some embodiments, a display panel DP may further include a protective member disposed on a rear surface of the substrate 100. The protective member and the substrate 100 may be combined with (e.g., coupled to or attached to) each other through an adhesive member.

In an embodiment, the input sensing layer 400 may be disposed on the thin film encapsulation layer 300. For example, in an embodiment, the input sensing layer 400 may be disposed directly on the thin film encapsulation layer 300. As used in the present disclosure, when an element B is described as being disposed directly (or directly disposed) on an element A, a separate adhesive layer/adhesive member may not be provided between the element A and the element B. For example, the element B may be formed in a continuous process on a base surface provided by the element A after the element A is formed. However, the present disclosure is not limited thereto, and in another embodiment, the input sensing layer 400 may be disposed on the thin film encapsulation layer 300 through the above-described adhesive member after being formed through a separate process, instead of being directly disposed on the thin film encapsulation layer 300.

In an embodiment, as shown in FIG. 2, the thin film encapsulation layer 300 may be disposed on the display layer 200, the input sensing layer 400 may be disposed (e.g., directly or indirectly) on the thin film encapsulation layer 300, and the antireflective layer 500 may be disposed (e.g., directly or indirectly) on the input sensing layer 400, and all of these layers may be disposed on the substrate 100. The substrate 100, the display layer 200, the thin film encapsulation layer 300, the input sensing layer 400, and the antireflective layer 500 may be defined as the display panel DP.

The antireflective layer 500 may reduce a reflectivity of external light incident from the upper side of the window layer 600. In the present embodiment, the antireflective layer 500 may include a black matrix 510 and a color filter 520, which are described in more detail below with reference to FIG. 11. The color filter 520 may be provided to correspond to a light-emitting area of each pixel P, and the black matrix 510 may be provided to correspond to a non-light-emitting area between the pixels P. In an embodiment, an adhesive member may not be provided between the input sensing layer 400 and the antireflective layer 500, and the antireflective layer 500 may be disposed directly on the input sensing layer 400, but the present disclosure is not limited thereto.

Although FIG. 2 illustrates that the antireflective layer 500 is disposed on the input sensing layer 400, in another embodiment, the antireflective layer 500 may be disposed (e.g., directly or indirectly) on the thin film encapsulation layer 300, or the input sensing layer 400 may be disposed on the antireflective layer 500.

Figure 3:
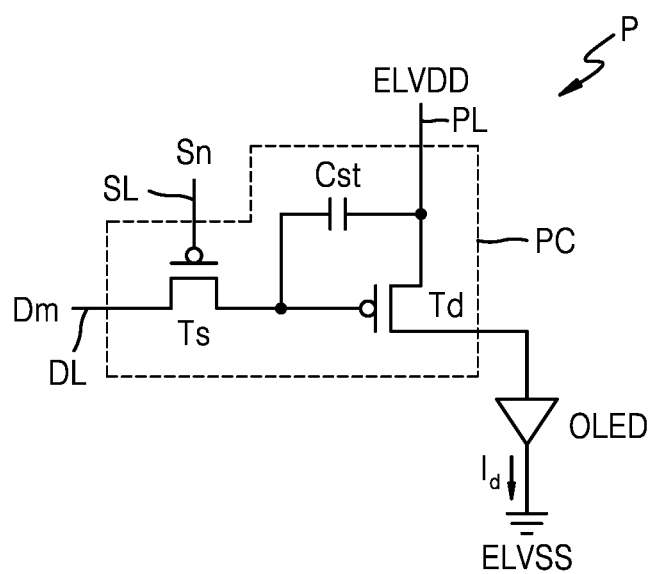
FIG. 3 is an equivalent circuit diagram of a pixel included in a display apparatus according to an embodiment.

FIG. 3 is an equivalent circuit diagram of the pixel P included in the display apparatus 1 according to an embodiment.

Referring to FIG. 3, each pixel P may include a pixel circuit PC connected to a scan line SL and a data line DL, and an organic light-emitting diode OLED as a display device connected to the pixel circuit PC.

The pixel circuit PC may include a driving thin film transistor Td, a switching thin film transistor Ts, and a storage capacitor Cst. The switching thin film transistor Ts may be connected to the scan line SL and the data line DL, and may transmit to the driving thin film transistor Td, a data signal Dm input through the data line DL in response to a scan signal Sn input through the scan line SL.

The storage capacitor Cst may be connected to the switching thin film transistor Ts and a driving voltage line PL, and may store a voltage corresponding to a difference between a voltage received from the switching thin film transistor Ts and a driving voltage ELVDD supplied to the driving voltage line PL.

The driving thin film transistor Td may be connected to the driving voltage line PL and the storage capacitor Cst, and may control a driving current $I_d$ flowing in the OLED from the driving voltage line PL corresponding to (e.g., according to) the voltage (e.g., a value or a level thereof) stored in the storage capacitor Cst. The OLED may emit light having a desired luminance (e.g., a predetermined or certain luminance) by the driving current $I_d$.

Although FIG. 3 illustrates an embodiment in which the pixel circuit PC includes two thin film transistors and one storage capacitor, the present disclosure is not limited thereto. For example, in another embodiment, the pixel circuit PC may include seven thin film transistors and one storage capacitor. As another example, in another embodiment, the pixel circuit PC may include two or more storage capacitors.

Figure 4:
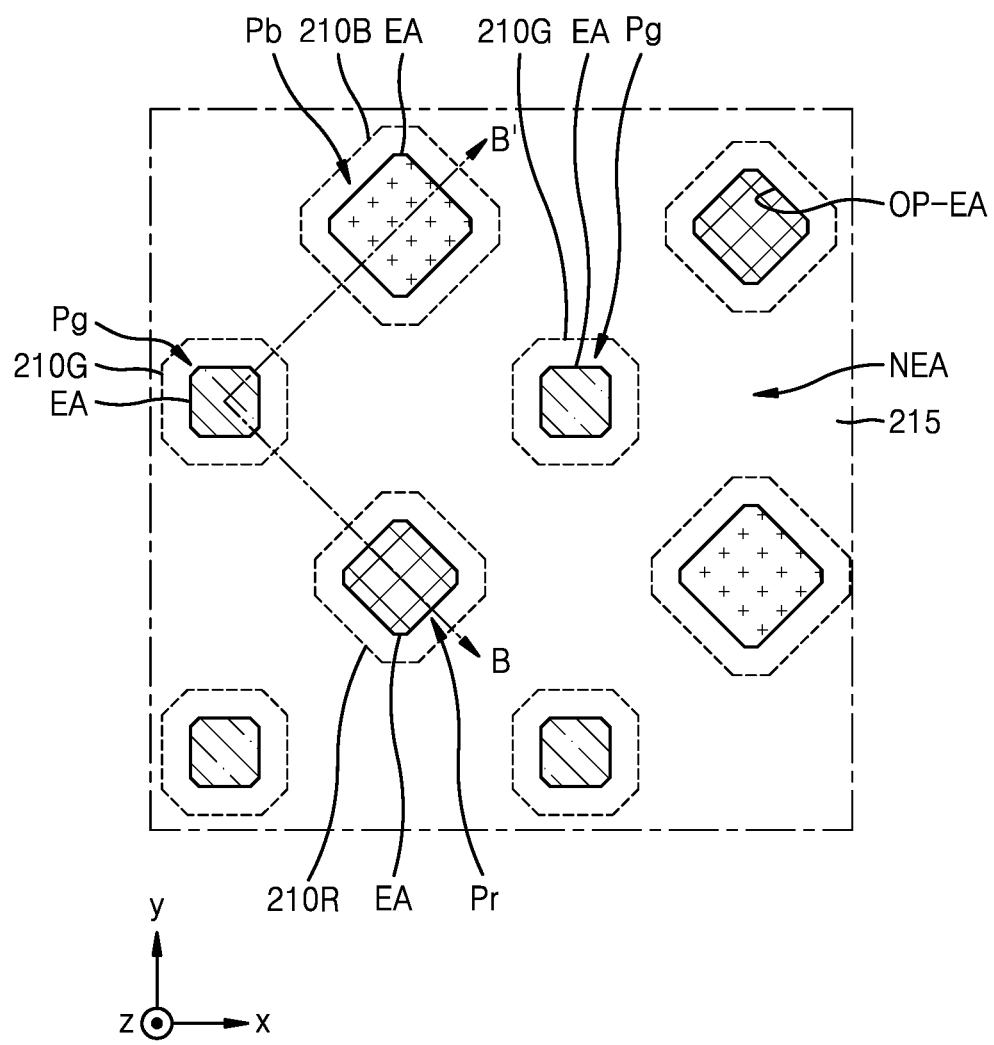
FIG. 4 is a schematic plan view of a portion of a display area of a display apparatus according to an embodiment.

FIG. 4 is a schematic plan view of a portion of the display area DA of a display apparatus according to an embodiment.

Referring to FIG. 4, the pixels P may be arranged at (e.g., in or on) the display area DA. Each of the pixels P may include a display element, for example, such as the organic light-emitting diode OLED. In the present disclosure, each pixel P may be a sub-pixel that emits red, green, blue, or white light, but the present disclosure is not limited thereto.

In an embodiment, the pixels P arranged at (e.g., in or on) the display area DA may include a first pixel Pr for emitting red light, a second pixel Pg for emitting green light, and a third pixel Pb for emitting blue light. Although FIG. 4 illustrates that the pixels P are arranged in a diamond shaped structure of an RGBG type arrangement (e.g., in a PEN-TILE® arrangement, PENTILE® being a duly registered trademark of Samsung Display Co., Ltd.), the pixels P may be arranged in various suitable forms, for example, such as a stripe type arrangement, another suitably shaped RGBG type arrangement, and/or the like. In an embodiment, assuming that virtual cells are provided in a lattice shape, two pixels P may be arranged in one cell. For example, in FIG. 4, the first pixel Pr for emitting red light and the second pixel Pg for emitting green light, or the second pixel Pg for emitting green light and the third pixel Pb for emitting blue light, may be arranged in one cell.

The first to third pixels Pr, Pg, and Pb may include organic light-emitting diodes OLED1, OLED2, and OLED3 (e.g., see FIG. 5), respectively. The organic light-emitting diodes OLED1, OLED2, and OLED3 may include a counter electrode 230 (e.g., see FIG. 5). The organic light-emitting diodes OLED1, OLED2, and OLED3 may further respectively include pixel electrodes 210R, 210G, and 210B, and first, second, and third intermediate layers 220R, 220G, and 220B, which are arranged between the counter electrode 230 and the pixel electrodes 210R, 210G, and 210 (e.g., see FIG. 5). The first, second, and third intermediate layers 220R, 220G, and 220B may include first, second, and third emission layers 222r, 222g, and 222b, respectively, disposed on the pixel electrodes 210R, 210G, and 210B, and first and second common layers 221 and 223 (e.g., see FIG. 5), which are commonly disposed above and/or below the first, second, and third emission layers 222r, 222g, and 222b across the pixels Pr, Pg, and Pb.

A pixel definition layer 215 may have openings OP-EA for exposing center portions of the pixel electrodes 210R, 210G, and 210B, and the first, second, and third emission layers 222r, 222g, and 222b may be arranged in the openings OP-EA. Light-emitting areas EA of the pixels Pr, Pg, and Pb may be defined by the openings OP-EA.

A non-light-emitting area NEA may be provided between the pixels Pr, Pg, and Pb. The non-light-emitting area NEA may be the same or substantially the same as an area between the light-emitting areas EA. A portion of the first and second common layers 221 and 223 at (e.g., in or on) the non-light-emitting area NEA (e.g., see FIG. 5) may have physical properties different from that of a portion thereof corresponding to the light-emitting areas EA, which is described in more detail below with reference to FIG. 5.

Figure 5:
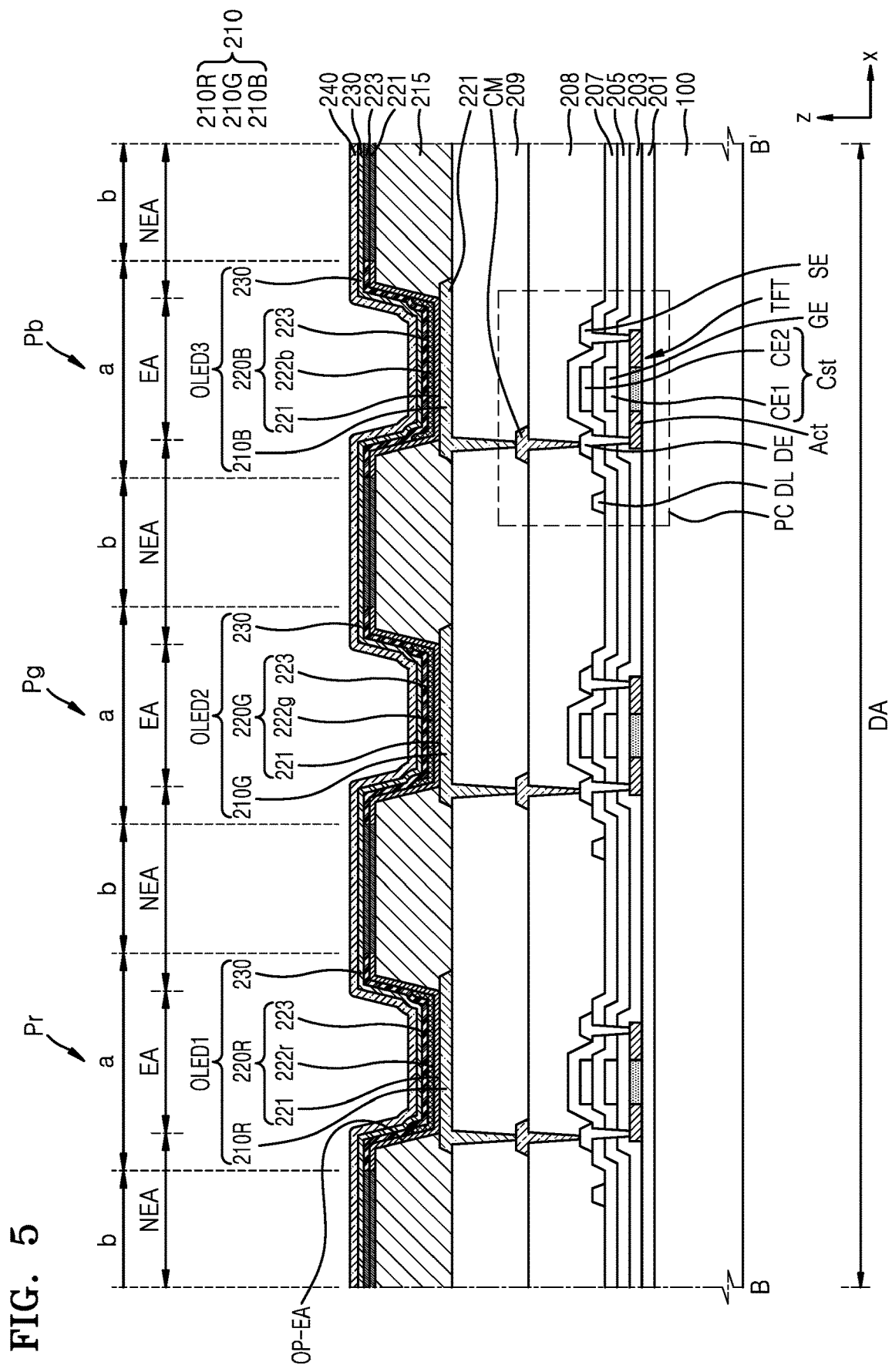
FIG. 5 is a schematic cross-sectional view of a portion of a display apparatus according to an embodiment.
Figure 6:
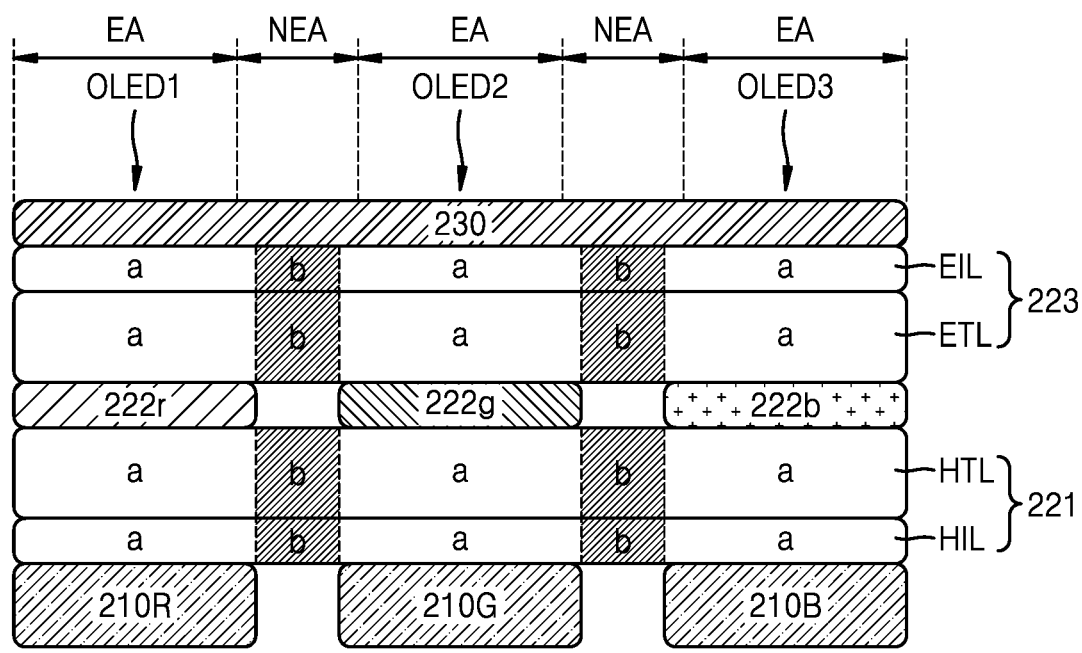
FIG. 6 is a schematic cross-sectional view of first to third organic light-emitting diodes in a display apparatus according to an embodiment.

FIG. 5 is a schematic cross-sectional view of a portion of a display apparatus according to an embodiment. FIG. 6 is a schematic cross-sectional view of the first to third organic light-emitting diodes OLED1, OLED2, and OLED3 in the display apparatus according to an embodiment. FIG. 5 is a cross-sectional view of the display apparatus of FIG. 4, taken along the line B-B'.

Referring to FIGS. 5 and 6, the first to third pixels Pr, Pg, and Pb are disposed on the substrate 100. The first to third pixels Pr, Pg, and Pb may include first to third organic light-emitting diodes OLED1, OLED2, and OLED3, respectively, and the pixel circuit PC. Each of the first to third organic light-emitting diodes OLED1, OLED2, and OLED3 may be electrically connected to a corresponding pixel circuit PC, so that light emission thereof may be controlled. The pixel circuit PC included in each of the first to third pixels Pr, Pg, and Pb may have the same or substantially the same structure as each other, and a stack structure is described in more detail hereinafter with respect to one pixel.

The substrate 100 may include a glass material or a polymer resin. In an embodiment, the substrate 100 may include a plurality of sub-layers. The sub-layers may be a structure in which an organic layer and an inorganic layer are alternately stacked. The substrate 100 may include any suitable polymer resin, for example, such as polyethersulfone, polyacrylate, polyetherimide, polyethylene naphthalate, polyethylene terephthalate, polyphenylene sulfide, polyarylate, polyimide, polycarbonate, or cellulose acetate propionate.

The display layer 200 including a display element, for example, such as an organic light-emitting diode, and a thin film encapsulation layer covering the display layer 200, may be disposed on the substrate 100. The display layer 200 is described in more detail below.

A buffer layer 201 formed to prevent or substantially prevent infiltration of impurities into a semiconductor layer Act of a thin film transistor TFT may be formed on the substrate 100. The buffer layer 201 may include an inorganic insulating material, such as silicon nitride, silicon oxynitride, and/or silicon oxide, and may be a single layer or multilayers including one or more of the above-described inorganic insulating materials.

The pixel circuit PC may be disposed on the buffer layer 201. A corresponding pixel circuit PC may be provided to correspond to each pixel P. The pixel circuit PC may include the thin film transistor TFT and the storage capacitor Cst.

The thin film transistor TFT may include the semiconductor layer Act, a gate electrode GE, a source electrode SE, and a drain electrode DE.

The data line DL of the pixel circuit PC may be electrically connected to a switching thin film transistor included in the pixel circuit PC. While a top gate type thin film transistor TFT is illustrated in the present embodiment in which the gate electrode GE is disposed on the semiconductor layer Act with a gate insulating layer 203 therebetween, according to another embodiment, the thin film transistor TFT may be of a bottom gate type.

The semiconductor layer Act may include polysilicon. As another example, the semiconductor layer Act may include amorphous silicon, an oxide semiconductor, an organic semiconductor, and/or the like.

The gate electrode GE may include a low-resistance metal material. The gate electrode GE may include a conductive material including molybdenum (Mo), aluminum (Al), copper (Cu), titanium (Ti), and/or the like, and may be formed in multilayers or a single layer including one or more of the above materials.

The gate insulating layer 203 between the semiconductor layer Act and the gate electrode GE may include an inorganic insulating material, such as silicon oxide, silicon nitride, silicon oxynitride, aluminum oxide, titanium oxide, tantalum oxide, hafnium oxide, and/or the like. The gate insulating layer 203 may be a single layer or multilayers including one or more of the above-described materials.

The source electrode SE and the drain electrode DE may be located at (e.g., in or on) the same layer as that of the data line DL, and may include the same material as that of the data line DL. The source electrode SE, the drain electrode DE, and the data line DL may include a material exhibiting a suitable conductivity (e.g., excellent conductivity). The source electrode SE and the drain electrode DE may include a conductive material including Mo, Al, Cu, Ti, and/or the like, and may be formed in multilayers or a single layer including one or more of the above materials. In an embodiment, the source electrode SE, the drain electrode DE, and the data line DL may be formed in multilayers (e.g., a stack) of Ti/Al/Ti.

The storage capacitor Cst may include a lower electrode CE1 and an upper electrode CE2, which overlap with each other with a first interlayer insulating layer 205 therebetween. The storage capacitor Cst may overlap with the thin film transistor TFT. In the present embodiment, FIG. 5 illustrates that the gate electrode GE of the thin film transistor TFT is the lower electrode CE1 of the storage capacitor Cst. In another embodiment, the storage capacitor Cst may not overlap with the thin film transistor TFT. The storage capacitor Cst may be covered by a second interlayer insulating layer 207. An upper electrode CE2 of the storage capacitor Cst may include a conductive material including Mo, Al, Cu, Ti, and/or the like, and may be formed in multilayers or a single layer including one or more of the above materials.

The first interlayer insulating layer 205 and the second interlayer insulating layer 207 may include an inorganic insulating material, such as silicon oxide, silicon nitride, silicon oxynitride, aluminum oxide, titanium oxide, tantalum oxide, hafnium oxide, and/or the like. The first interlayer insulating layer 205 and the second interlayer insulating layer 207 may be a single layer or multilayers including one or more of the above-described materials.

The pixel circuit PC including the thin film transistor TFT and the storage capacitor Cst may be covered by a first organic insulating layer 208. The first organic insulating layer 208 may have an upper surface that is flat or substantially flat (e.g., that is approximately flat).

In some embodiments, a third interlayer insulating layer may be further disposed below the first organic insulating layer 208. The third interlayer insulating layer may include an inorganic insulating material, such as silicon oxide, silicon nitride, and/or silicon oxynitride.

The pixel circuit PC may be electrically connected to a pixel electrode 210. For example, as illustrated in FIG. 5, a contact metal layer CM may be provided between the thin film transistor TFT and the pixel electrode 210. The contact metal layer CM may be connected to the thin film transistor TFT through a contact hole formed in the first organic insulating layer 208, and the pixel electrode 210 may be connected to the contact metal layer CM through a contact hole formed in a second organic insulating layer 209 on the contact metal layer CM. The contact metal layer CM may include a conductive material including Mo, Al, Cu, Ti, and/or the like, and may be formed in multilayers or a single layer including one or more of the above materials. In an embodiment, the contact metal layer CM may be formed in multilayers (e.g., a stack) of Ti/Al/Ti.

The first organic insulating layer 208 and the second organic insulating layer 209 may include an organic insulating material, such as a general purpose polymer, for example, such as polymethylmethacrylate (PMMA) or polystyrene (PS), polymer derivatives having a phenolic group, acrylic polymers, imide-based polymers, arylether-based polymers, amide-based polymers, fluorine-based polymers, p-xylene-based polymers, vinyl alcohol-based polymers, and/or blends thereof. In an embodiment, the first organic insulating layer 208 and the second organic insulating layer 209 may include polyimide.

The first to third organic light-emitting diodes OLED1, OLED2, and OLED3 may be disposed on the second organic insulating layer 209. The first organic light-emitting diode OLED1 may include a first pixel electrode 210R, the first common layer 221, the first emission layer 222r, the second common layer 223, and the counter electrode 230. The second organic light-emitting diode OLED2 may include a second pixel electrode 210G, the first common layer 221, the second emission layer 222g, the second common layer 223, and the counter electrode 230. The third organic light-emitting diode OLED3 may include a third pixel electrode 210B, the first common layer 221, the third emission layer 222b, the second common layer 223, and the counter electrode 230. In the first to third organic light-emitting diodes OLED1, OLED2, and OLED3, the first to third pixel electrodes 210R, 210G, and 210B, and the first to third emission layers 222r, 222g, and 222b may be individually provided by being patterned for each pixel, and the first common layer 221, the second common layer 223, and the counter electrode 230 may be integrally (e.g., commonly) provided at (e.g., in or on) the display area DA.

The pixel electrode 210, for example, the first pixel electrode 210R, may include a conductive oxide, for example, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 210 may include a reflective film including silver (Ag), magnesium (Mg), Al, platinum (Pt), palladium (Pd), gold (Au), nickel (Ni), neodymium (Nd), iridium (Ir), chromium (Cr), or a compound thereof. In another embodiment, the pixel electrode 210 may further include a film formed above and/or below the above-described reflective film, and the film may include ITO, IZO, ZnO, or $In_2O_3$.

The pixel definition layer 215 may be formed on the pixel electrode 210. The pixel definition layer 215 may cover an edge of the pixel electrode 210, and may include the opening OP-EA that exposes an upper surface of the pixel electrode 210. The pixel definition layer 215 may include an organic insulating material. As another example, the pixel definition layer 215 may include an inorganic insulating material, such as silicon nitride, silicon oxynitride, or silicon oxide. As another example, the pixel definition layer 215 may include an organic insulating material and an inorganic insulating material.

The Intermediate layer, for example, the first intermediate layer 220R, may include an emission layer, for example, the first emission layer 222r. The first emission layer 222r may include a polymer or a low molecular weight organic material that emits light of a suitable color (e.g., a predetermined or certain color).

Furthermore, the first intermediate layer 220R may include the first common layer 221 disposed below the first emission layer 222r, and/or the second common layer 223 disposed above the first emission layer 222r.

The first common layer 221 may be a single layer or multilayers. For example, when the first common layer 221 includes a polymer material, the first common layer 221 may be a hole transport layer (HTL) having a single layer structure, and may include poly-(3,4)-ethylene-dihydroxy thiophene (PEDOT) or polyaniline (PANI). When the first common layer 221 includes a low molecular weight material, the first common layer 221 may include a hole injection layer (HIL) and a hole transport layer (HTL).

The second common layer 223 may be omitted according to a structure of the organic light-emitting diode OLED. For example, when the first common layer 221 and the first emission layer 222r include a polymer material, the second common layer 223 may be formed. The second common layer 223 may be a single layer or multilayers. The second common layer 223 may include an electron transport layer (ETL) and/or an electron injection layer (EIL).

The counter electrode 230 may include a conductive material having a low work function. For example, the counter electrode 230 may include a (semi-) transparent layer including Ag, Mg, Al, Pt, Pd, Au, Ni, Nd, Ir, Cr, lithium (Li), calcium (Ca), or an alloy thereof. As another example, the counter electrode 230 may further include a layer such as ITO, IZO, ZnO, or $In_2O_3$ on the (semi-) transparent layer including one or more of the above-described materials. The counter electrode 230 may be formed not only at (e.g., in or on) the display area DA, but also at (e.g., in or on) the peripheral area NDA.

The first common layer 221, the second common layer 223, and the counter electrode 230 may be formed on an entire surface or substantially entire surface of the substrate 100 by a thermal deposition method.

In some embodiments, a capping layer 240 may be located on the counter electrode 230. For example, the capping layer 240 may include a material selected from among an organic material, an inorganic material, and/or a mixture thereof, and may be provided as a single layer or multilayers. In an embodiment, a lithium fluoride (LiF) layer may be optionally located on the capping layer 240.

In the present embodiment, the first common layer 221 and the second common layer 223 may each include a first part a corresponding to a light-emitting area EA, and a second part b corresponding to the non-light-emitting area NEA between the light-emitting areas EA. The first to third organic light-emitting diodes OLED1, OLED2, and OLED3 are described in more detail below with reference to FIG. 6.

Referring to FIG. 6, the first to third pixel electrodes 210R, 210G, and 210B provided in the first to third organic light-emitting diodes OLED1, OLED2, and OLED3, respectively, may be patterned for the pixels. The counter electrode 230 of the first to third organic light-emitting diodes OLED1, OLED2, and OLED3 may be integrally provided across the first to third organic light-emitting diodes OLED1, OLED2, and OLED3.

The first to third organic light-emitting diodes OLED1, OLED2, and OLED3 may include the first to third intermediate layers 220R, 220G, and 220B, respectively. Each of the first to third intermediate layers 220R, 220G, and 220B may include a plurality of layers. The first to third emission layers 222r, 222g, and 222b may be individually provided by being patterned for the first to third organic light-emitting diodes OLED1, OLED2, and OLED3, respectively, and the first and second common layers 221 and 223 may be integrally provided across the first to third organic light-emitting diodes OLED1, OLED2, and OLED3.

The first to third organic light-emitting diodes OLED1, OLED2, and OLED3 may commonly include the first common layer 221 provided between the first to third pixel electrodes 210R, 210G, and 210B and the first to third emission layers 222r, 222g, and 222b. The first to third organic light-emitting diodes OLED1, OLED2, and OLED3 may commonly include the second common layer 223 provided between the first to third emission layers 222r, 222g, and 222b and the counter electrode 230.

The first to third emission layers 222r, 222g, and 222b may emit light of different colors from each other. In an embodiment, the first emission layer 222r may include an organic material for emitting red light, the second emission layer 222g may include an organic material for emitting green light, and the third emission layer 222b may include an organic material for emitting blue light. In an example, the first emission layer 222r may be formed by using, for example, a red dopant in a suitable (e.g., a predetermined or certain) host material. The second emission layer 222g may be formed by using, for example, a green dopant in a suitable (e.g., a predetermined or certain) host material. The third emission layer 222b may be formed by using, for example, a blue dopant in a suitable (e.g., a predetermined or certain) host material.

The first common layer 221 may include a hole injection layer HIL and a hole transport layer HTL, and the second common layer 223 may include an electron transport layer ETL and an electron injection layer EIL. Although FIG. 6 illustrates that each of the first to third organic light-emitting diodes OLED1, OLED2, and OLED3 includes all of the hole injection layer HIL, the hole transport layer HTL, the electron transport layer ETL, and the electron injection layer EIL, the present disclosure is not limited thereto. In another embodiment, at least one of the hole injection layer HIL, the hole transport layer HTL, the electron transport layer ETL, and the electron injection layer EIL may be omitted.

The hole injection layer HIL may be commonly applied to the first to third organic light-emitting diodes OLED1, OLED2, and OLED3. The hole injection layer HIL may facilitate injection of holes, and may include any one selected from the group consisting of HATCN and copper phthalocyanine (CuPc), poly(3,4)-ethylenedioxythiophene (PEDOT), polyaniline (PANI), and N, N-dinaphthyl-N, N'-diphenylbenzidine (NPD), but the present disclosure is not limited thereto.

The hole transport layer HTL may include a triphenylamine derivative having high hole mobility and excellent stability, such as N, N'-diphenyl-N,N'-bis(3-methylphenyl)-

1,1'-bi-phenyl-4,4'-diamine (TPD) or N,N'-di(naphthalen-1-yl)-N,N'-diphenyl-benzidine (NPB), and/or the like, as a host of the hole transport layer HTL.

The electron transport layer ETL may facilitate transport of electrons, and may include any one selected from the group consisting of tris(8-hydroxyquinolino)aluminum (Alq3), 2-(4-biphenylyl)-5-(4-tert-butylphenyl)-1,3,4oxadiazole (PBD), 3-(4-biphenyl)4-phenyl-5-tert-butylphenyl-1,2,4-triazole (TAZ), spiro-PBD, bis(2-methyl-8-quinolinolate)-4-(phenylphenolato)aluminium (BAlq), lithium quinolate (Liq), BMB-3T, PF-6P, TPBI, COT, and SAlq, but the present disclosure is not limited thereto.

The electron injection layer EIL may facilitate injection of electrons, and may use Yb, Alq3, PBD, TAZ, spiro-PBD, BAlq, or SAlq, but the present disclosure is not limited thereto.

In an embodiment, the first and second common layers 221 and 223 may each include the first part a corresponding to the pixel electrode 210, and the second part b corresponding to an area between the pixel electrodes 210. In other words, in the first and second common layers 221 and 223, the first part a may correspond to the light-emitting area EA, and the second part b may correspond to the non-light-emitting area NEA. In the first and second common layers 221 and 223, an area other than the second part b corresponding to at least part of the non-light-emitting area NEA may be the first part a. In other words, a portion of the first part a may be at (e.g., in or on) the non-light-emitting area NEA.

As illustrated in FIG. 5, the width of the first part a may be greater than the width of the light-emitting area EA, and the width of the second part b may be less than the width of the non-light-emitting area NEA. As described in more detail below, as the second part b may be formed by irradiating light onto the first and second common layers 221 and 223 to degrade a corresponding portion, by forming the width of the first part a, where the light is blocked, to be greater than the width of the light-emitting area EA, where light is emitted or substantially emitted, the first to third emission layers 222r, 222g, and 222b may be prevented or substantially prevented from being damaged by heat. Accordingly, the first part a may partially overlap with the non-light-emitting area NEA at an edge thereof. The width of the first part a may be equal to (or substantially equal to) or greater than (e.g., slightly greater than) the width of the pixel electrode 210.

The electrical conductivity of the first part a may be different from that of the second part b in the first and second common layers 221 and 223 that are each integrally formed. In an example, the electrical conductivity of the second part b may be less than that of the first part a. The electrical conductivity of the second part b may be about 10 times to 30 times less than that of the first part a.

Such a difference in electrical conductivity between the first and second parts a and b may be implemented by degrading the second part b of the first and second common layers 221 and 223 that are each integrally formed. In other words, the performance of parts of the first and second common layers 221 and 223 including an organic material may be lowered by irradiating light corresponding to the second part b of the first and second common layers 221 and 223. As the electrical conductivity of the second part b is remarkably lower than that of the first part a, no leakage current may be generated by the second part b, and thus, an effect of being electrically short-circuited may be implemented.

Such a difference in electrical conductivity may be checked by measuring the electrical conductivity of one pixel and another pixel adjacent thereto. For example, a first current amount at one pixel may be measured by applying a voltage between a pixel electrode and a counter electrode of the one pixel, and a second current amount between the one pixel and another pixel adjacent thereto may be measured by applying a voltage between the pixel electrode of the one pixel and a pixel electrode (or a counter electrode) of the adjacent pixel. In this case, the measured second current amount may be determined to be a leakage current, and as the second current amount converges to 0, it may mean that there is no leakage current. The current amount may be measured down to a unit of pico-amperes (pA) through the above measurement method. In the display apparatus according to an embodiment, the second current amount measured between one pixel and a pixel adjacent thereto may be about 10 times to about 1000 times less than the first current amount of the one pixel.

In an example, in the first and second common layers 221 and 223, the second part b that is degraded may be thinner than the first part a. In the degradation process, the structure of an organic material in the second part b may be changed, or part of the upper surface of the second part b may be removed. Such a structural difference may be checked by using a transmission electron microscopy (TEM) image or an organic material structure analysis apparatus.

As such, in the display apparatus according to an embodiment, by lowering the electrically conductivity characteristics of the second part b of the first and second common layers 221 and 223 corresponding to the light-emitting area EA and the non-light-emitting area NEA of each of the pixels Pr, Pg, and Pb, the light emission of an adjacent pixel due to a leakage current may be prevented or substantially prevented (e.g., effectively prevented), and display quality of the display apparatus may be improved.

Figure 7:
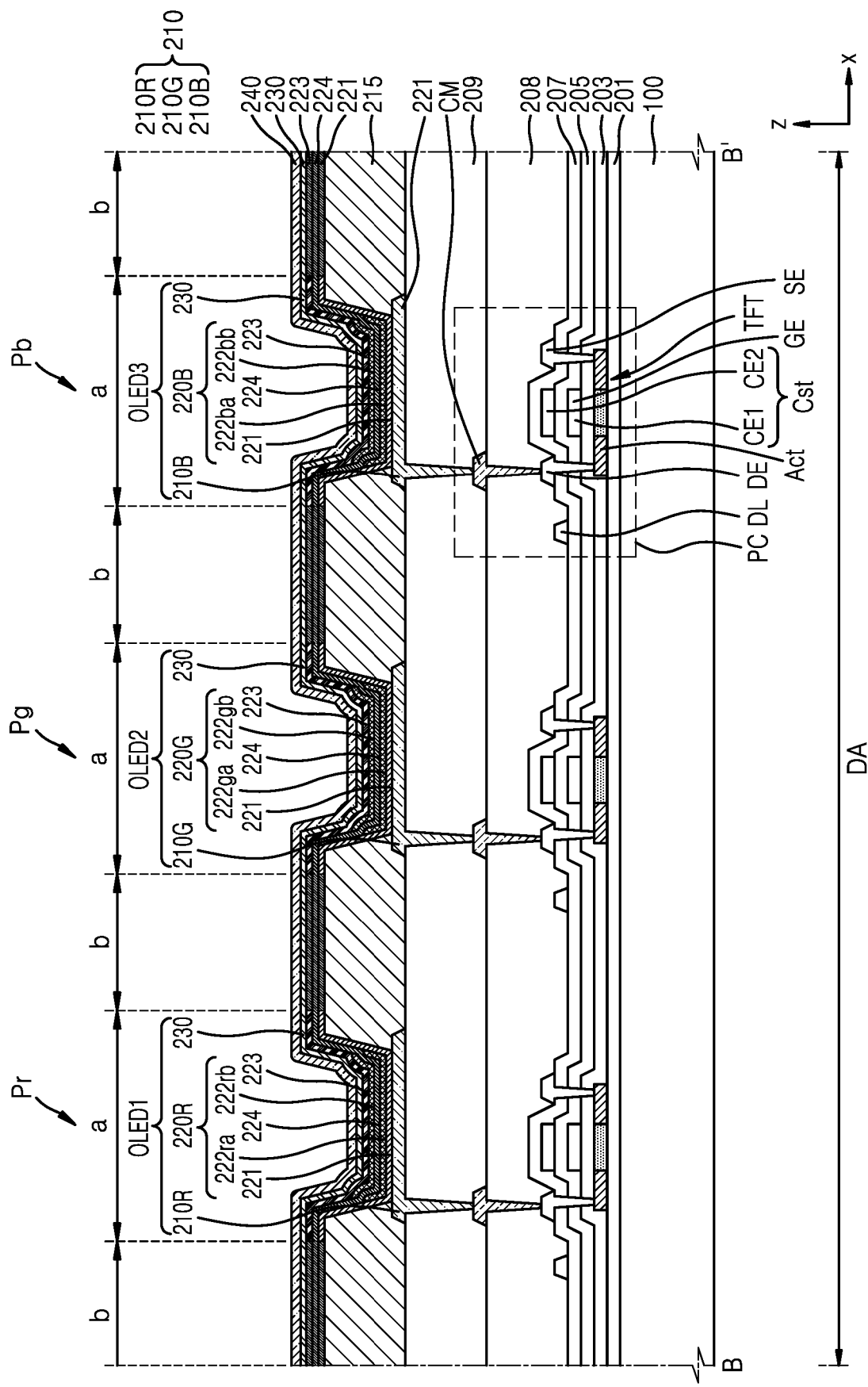
FIG. 7 is a schematic cross-sectional view of a portion of a display apparatus according to another embodiment.
Figure 8:
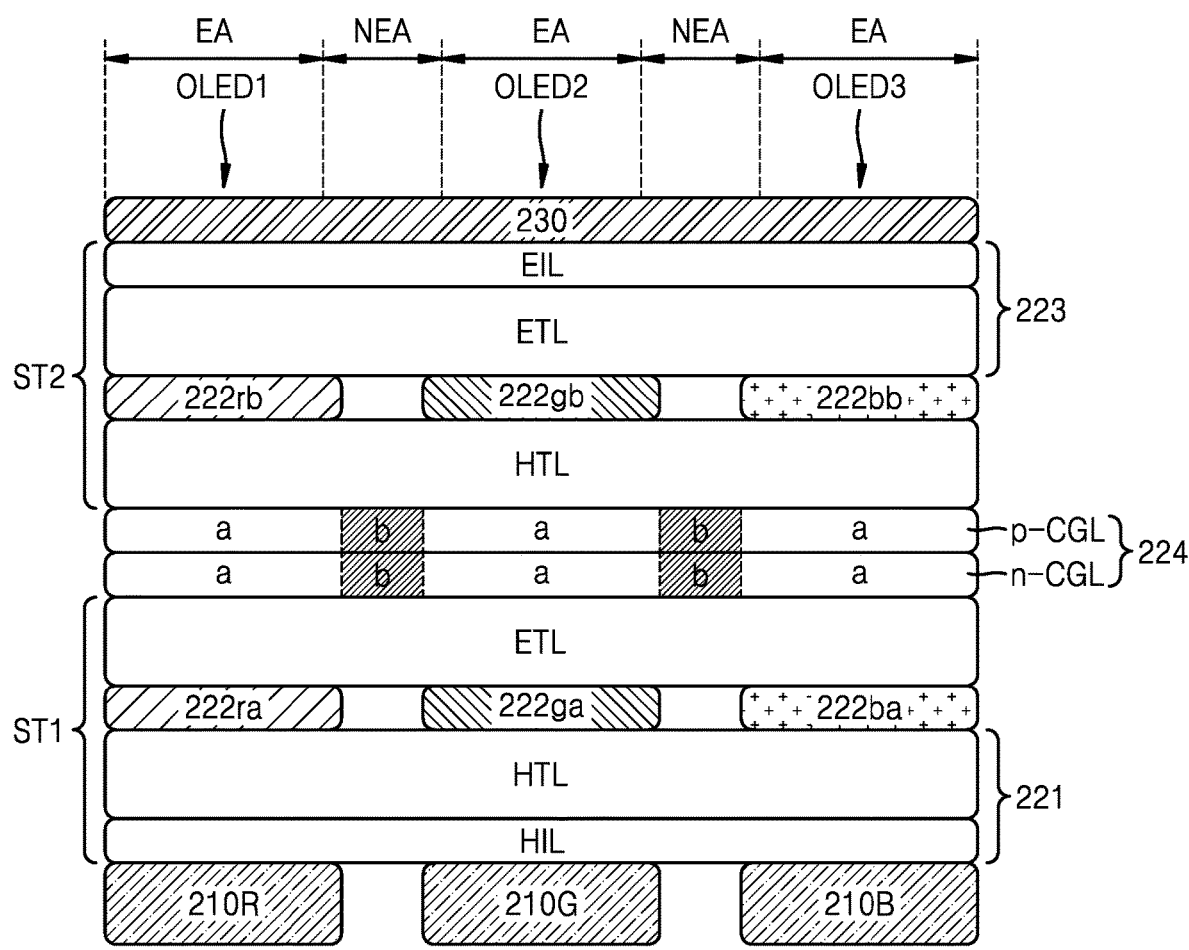
FIG. 8 is a schematic cross-sectional view of first to third organic light-emitting diodes in a display apparatus according to an embodiment.
Figure 9:
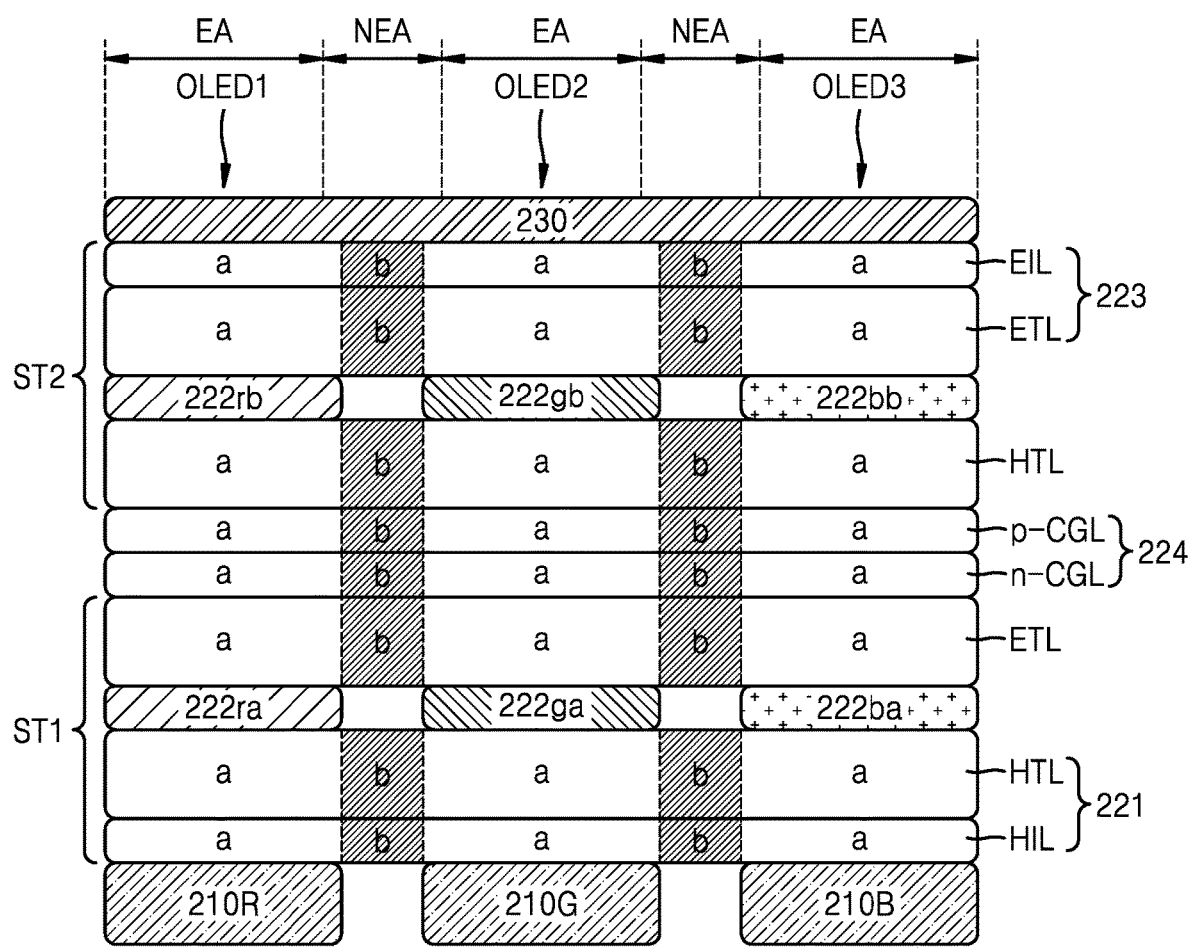
FIG. 9 is a schematic cross-sectional view of first to third organic light-emitting diodes in a display apparatus according to a modified example of FIG. 8.

FIG. 7 is a schematic cross-sectional view of a portion of a display apparatus according to another embodiment. FIG. 8 is a schematic cross-sectional view of the first to third organic light-emitting diodes OLED1, OLED2, and OLED3 in the display apparatus according to an embodiment. FIG. 9 is a modified example of the embodiment shown in FIG. 8. FIG. 7 may correspond to the cross-sectional view of the display apparatus of FIG. 4, taken along the line B-B'.

The embodiment shown in FIG. 7 may be the same or substantially the same as (or similar to) the embodiment shown in FIG. 5, except that the structures of the first to third organic light-emitting diodes OLED1, OLED2, and OLED3 may be different. As the configuration of the pixel circuit PC in FIG. 7 is the same or substantially the same as that of FIG. 5, redundant description may not be repeated, and the differences between the first to third organic light-emitting diodes OLED1, OLED2, and OLED3 of the embodiments of FIGS. 5 and 7 may be mainly described herein after.

Referring to FIGS. 7 and 8, the first to third pixel electrodes 210R, 210G, and 210B provided in the first to third organic light-emitting diodes OLED1, OLED2, and OLED3, respectively, may be patterned for the pixels. The counter electrode 230 of the first to third organic light-emitting diodes OLED1, OLED2, and OLED3 may be integrally provided across the first to third organic light-emitting diodes OLED1, OLED2, and OLED3. The first to third intermediate layers 220R, 220G, and 220B may be arranged between the first to third pixel electrodes 210R, 210G, and 210B and the counter electrode 230.

Each of the first to third organic light-emitting diodes OLED1, OLED2, and OLED3 may be provided with a tandem structure including a plurality of emission layers.

In an embodiment, each of the first to third intermediate layers 220R, 220G, and 220B may include a plurality of emission layers in one corresponding organic light-emitting diode. In other words, the first to third intermediate layers 220R, 220G, and 220B may include first to third lower emission layers 222ra, 222ga, and 222ba and first to third upper emission layers 222rb, 222gb, and 222bb, respectively, which are arranged to overlap with one another. The first to third lower emission layers 222ra, 222ga, and 222ba and the first to third upper emission layers 222rb, 222gb, and 222bb may be individually provided by being patterned for the first to third organic light-emitting diodes OLED1, OLED2, and OLED3, respectively.

Each of the first to third organic light-emitting diodes OLED1, OLED2, and OLED3 may emit light of one suitable color, for example, such as red, green, blue, or white. In order to implement the light emission, the first to third lower emission layers 222ra, 222ga, and 222ba and the first to third upper emission layers 222rb, 222gb, and 222bb may emit red, green, or blue light. For example, the first lower emission layer 222ra and the first upper emission layer 222rb of the first organic light-emitting diode OLED1, which are arranged to overlap with each other, may emit light of the same or substantially the same wavelength as each other, or light of different wavelengths from each other. For example, when the first organic light-emitting diode OLED1 has red light emission, the first lower emission layer 222ra may emit red light, and the first upper emission layer 222rb may identically emit red light. Furthermore, the second lower emission layer 222ga and the second upper emission layer 222gb of the second organic light-emitting diode OLED2 may emit light of the same or substantially the same wavelength as each other, or light of different wavelengths from each other. For example, when the second organic light-emitting diode OLED2 emits green light, the second lower emission layer 222ga may emit green light, and the second upper emission layer 222gb may identically emit green light. Furthermore, the third lower emission layer 222ba and the third upper emission layer 222bb of the third organic light-emitting diode OLED3 may emit light of the same or substantially the same wavelength as each other, or light of different wavelengths from each other. For example, when the third organic light-emitting diode OLED3 emits blue light, the third lower emission layer 222ba may emit blue light, and the third upper emission layer 222bb may identically emit blue light.

In an embodiment, a charge generation layer 224 may be disposed between the first to third lower emission layers 222ra, 222ga, and 222ba and the first to third upper emission layers 222rb, 222gb, and 222bb. The charge generation layer 224 may be commonly provided across the first to third organic light-emitting diodes OLED1, OLED2, and OLED3. The charge generation layer (CGL) 224 may supply electric charges to a first stack ST1 including the first to third lower emission layers 222ra, 222ga, and 222ba, and a second stack ST2 including the first to third upper emission layers 222rb, 222gb, and 222bb.

The charge generation layer 224 may include an n-type charge generation layer n-CGL to supply electrons to the first stack ST1, and a p-type charge generation layer p-CGL to supply holes to the second stack ST2.

The n-type charge generation layer n-CGL may include an n-type dopant material and an n-type host material. The n-type dopant material may include a metal of the first and second groups in the periodic table, an organic material capable of injecting electrons, or a mixture thereof. For example, the n-type dopant material may include (e.g., may be) any one of an alkali metal and an alkali earth metal. In other words, although the n-type charge generation layer n-CGL may include an organic layer doped with an alkali metal, for example, such as Li, sodium (Na), potassium (K), or cesium (Cs), or an alkali earth metal, for example, such as Mg, strontium (Sr), barium (Ba), or radium (Ra), the present disclosure is not limited thereto. Although the n-type host material may include a material capable of transmitting electrons, for example, such as a material including any one or more of $Alq_3$, 8-hydroxyquinolinolato-lithium (Liq), PBD, TAZ, spiro-PBD, BAlq, SAlq, 2,2',2-(1,3,5-benzinetriyl)-tris(1-phenyl-1-H-benzimidazole) (TPBi), oxadiazole, triazole, phenanthroline, benzoxazole, or benzthiazole), the present disclosure is not limited thereto.

The p-type charge generation layer p-CGL may include a p-type dopant material and a p-type host material. The p-type dopant material may include an organic material, for example, such as a metal oxide, tetrafluoro-tetracyanoquinodimethane (F4-TCNQ), hexaazatriphenylene-hexacarbonitrile (HAT-CN), hexaazatriphenylene, and/or the like, or a metal material, for example, such as $V_2O_5$, MoOx, $WO_3$, and/or the like, but the present disclosure is not limited thereto. The p-type host material may include a material capable of transmitting holes, for example, such as a material including any one or more of NPD (N,N'-bis(naphthalene-1-yl)-N,N'-bis(phenyl)-2,2'-dimethylbenzidine), N,N'-bis-(3-methylphenyl)-N,N'-bis-(phenyl)-benzidine (TPD), or 4,4',4-Tris(N-3-methylphenyl-N-phenyl-amino)-triphenylamine (MTDATA), but the present disclosure is not limited thereto As illustrated in FIG. 8, the charge generation layer 224 may include the first part a corresponding to each pixel electrode 210, and the second part b corresponding to an area between the pixel electrodes 210. The first part a may correspond to the light-emitting area EA, and the second part b may correspond to the non-light-emitting area NEA between the light-emitting areas EA. In other words, the first part a of the charge generation layer 224 may be interpreted as a portion corresponding to each of the pixel electrodes 210R, 210G, and 210B that are patterned, and the second part b of the charge generation layer 224 may be interpreted as a portion corresponding to an area between the first to third pixel electrodes 210R, 210G, and 210B. In the charge generation layer 224, an area other than the second part b corresponding to at least part of the non-light-emitting area NEA may be the first part a. In other words, a portion of the first part a may be at (e.g., in or on) the non-light-emitting area NEA.

In the charge generation layer 224 that is integrally formed, the electrical conductivity of the first part a may be different from the electrical conductivity of the second part b. In an example, the electrical conductivity of the first part a may be greater than the electrical conductivity of the second part b. The electrical conductivity of the first part a may be about 10 times to about 30 times greater than the electrical conductivity of the second part b.

Such a difference in electrical conductivity may be implemented by degrading the second part b of the charge generation layer 224 that is integrally formed. In other words, the performance of a part of the charge generation layer 224 including an organic material may be lowered by irradiating light corresponding to the second part b of the charge generation layer 224. As the electrical conductivity of the second part b is remarkably lower than that of the first part a, a current flows only in a vertical direction through the first part a, and the flow of a current in a horizontal direction may be blocked by the second part b. In other words, a leakage current may not be generated by the second part b, and an effect of an electrical short-circuit may be implemented.

In some display apparatuses, as the distance between pixels decreases due to high resolution, a current applied to one pixel may leak along a common layer included in an intermediate layer, so that adjacent pixels that neighbor the pixel emit light.

According to one or more embodiments of the present disclosure, by lowering the electrical conductivity properties of the second part b of the charge generation layer 224 corresponding to the light-emitting area EA and the non-light-emitting area NEA of each of the pixels Pr, Pg, and Pb, the light-emitting of an adjacent pixel due to a leakage current may be prevented or substantially prevented (e.g., may be effectively prevented), and the display quality of the display apparatus may be improved.

Although FIG. 8 illustrates that both of the n-type charge generation layer n-CGL and the p-type charge generation layer p-CGL constituting the charge generation layer 224 include the second part b, at least part of which is degraded, the present disclosure is not limited thereto. In another embodiment, the second part b that is degraded may be provided only in the p-type charge generation layer p-CGL of the charge generation layer 224. In an embodiment, the electrical conductivity of the p-type charge generation layer p-CGL may be remarkably greater than that of the n-type charge generation layer n-CGL. In this case, to implement a substantially leakage current prevention effect, short-circuit of the p-type charge generation layer p-CGL may serve as a main factor.

The electron transport layer ETL may be provided between the n-type charge generation layer n-CGL and the first to third lower emission layers 222ra, 222ga, and 222ba, and the hole transport layer HTL may be provided between the p-type charge generation layer p-CGL and the first to third upper emission layers 222rb, 222gb, and 222bb.

Furthermore, the first and second common layers 221 and 223 may be integrally provided across the first to third organic light-emitting diodes OLED1, OLED2, and OLED3. The first to third organic light-emitting diodes OLED1, OLED2, and OLED3 may commonly include the first common layer 221 provided between the first to third pixel electrodes 210R, 210G, and 210B and the first to third lower emission layers 222ra, 222ga, and 222ba, and the second common layer 223 provided between the first to third upper emission layers 222rb, 222gb, and 222bb and the counter electrode 230.

The first common layer 221 may include the hole injection layer HIL and the hole transport layer HTL, and the second common layer 223 may include the electron transport layer ETL and the electron injection layer EIL. Although FIG. 8 illustrates that each of the first to third organic light-emitting diodes OLED1, OLED2, and OLED3 includes all of the hole injection layer HIL, the hole transport layer HTL, the electron transport layer ETL, and the electron injection layer EIL, the present disclosure is not limited thereto. In another embodiment, at least one of the hole injection layer HIL, the hole transport layer HTL, the electron transport layer ETL, and the electron injection layer EIL may be omitted. As the hole injection layer HIL, the hole transport layer HTL, the electron transport layer ETL, and the electron injection layer EIL of FIG. 8 are the same or substantially the same as those of FIG. 6 described above, redundant descriptions thereof may not be repeated.

As illustrated in FIG. 9, the second part b in which an organic material is degraded may be provided not only in the charge generation layer 224, but also in the electron transport layer ETL provided between the n-type charge generation layer n-CGL and the first to third lower emission layers 222ra, 222ga, and 222ba, the hole transport layer HTL provided between the p-type charge generation layer p-CGL and the first to third upper emission layers 222rb, 222gb, and 222bb, and the first and second common layers 221 and 223. The structure shown in FIG. 9 may reflect a manufacturing process, and generally, a degradation process is performed after the first to third intermediate layers 222R, 222G, and 222B are all formed and before the formation of the counter electrode 230. Accordingly, degradation is concurrently (e.g., simultaneously) performed in the charge generation layer 224, which is a part except the emission layers from the first to third intermediate layers 222R, 222G, and 222B, and the first and second common layers 221 and 223. In this case, the structure of FIG. 9 may be obtained. Even in this case, a range of degradation may be adjusted by controlling an intensity, a type, and/or the like of light irradiated for degradation.

Figure 10:
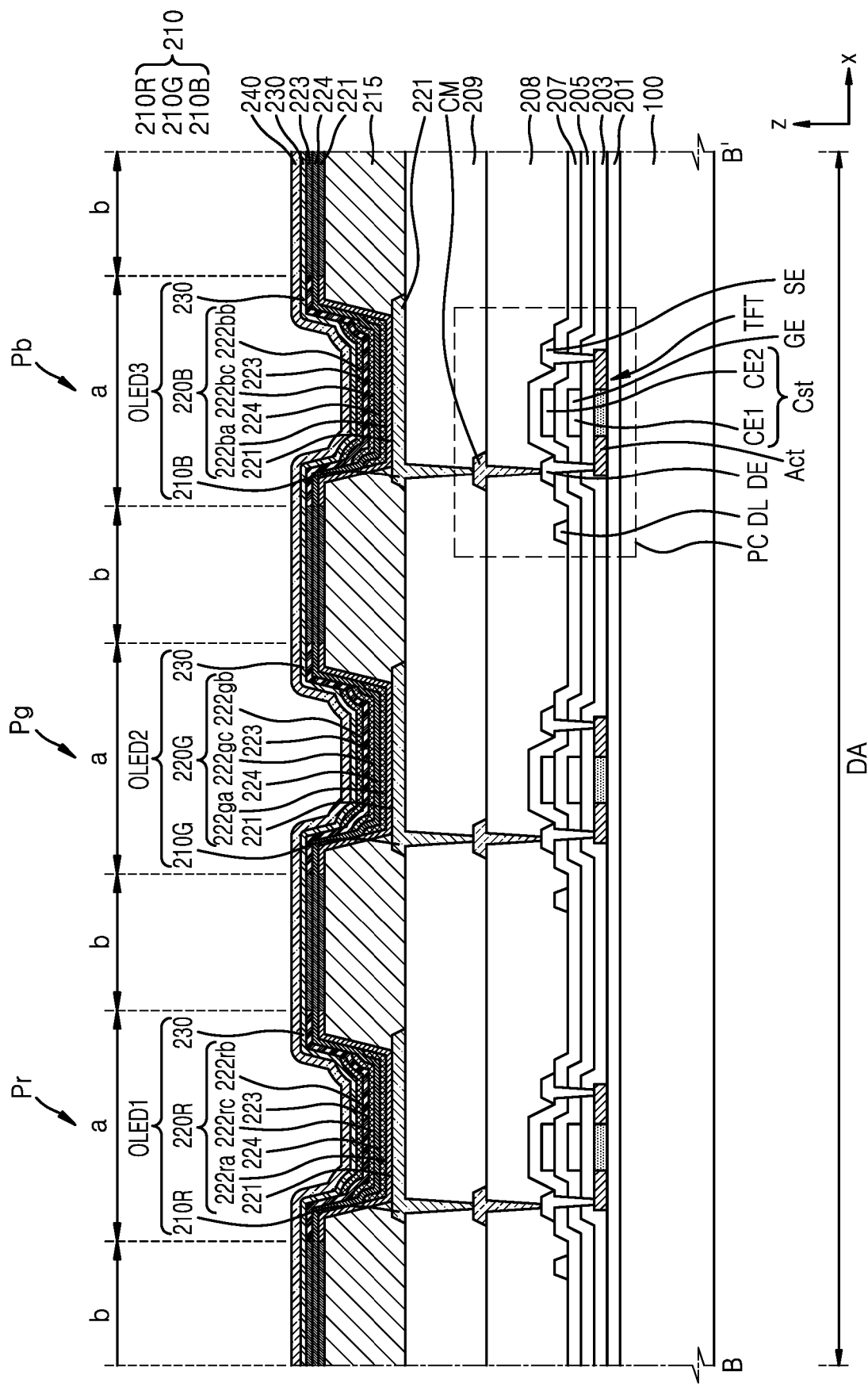
FIG. 10 is a schematic cross-sectional view of a portion of a display apparatus according to another embodiment.
Figure 11:
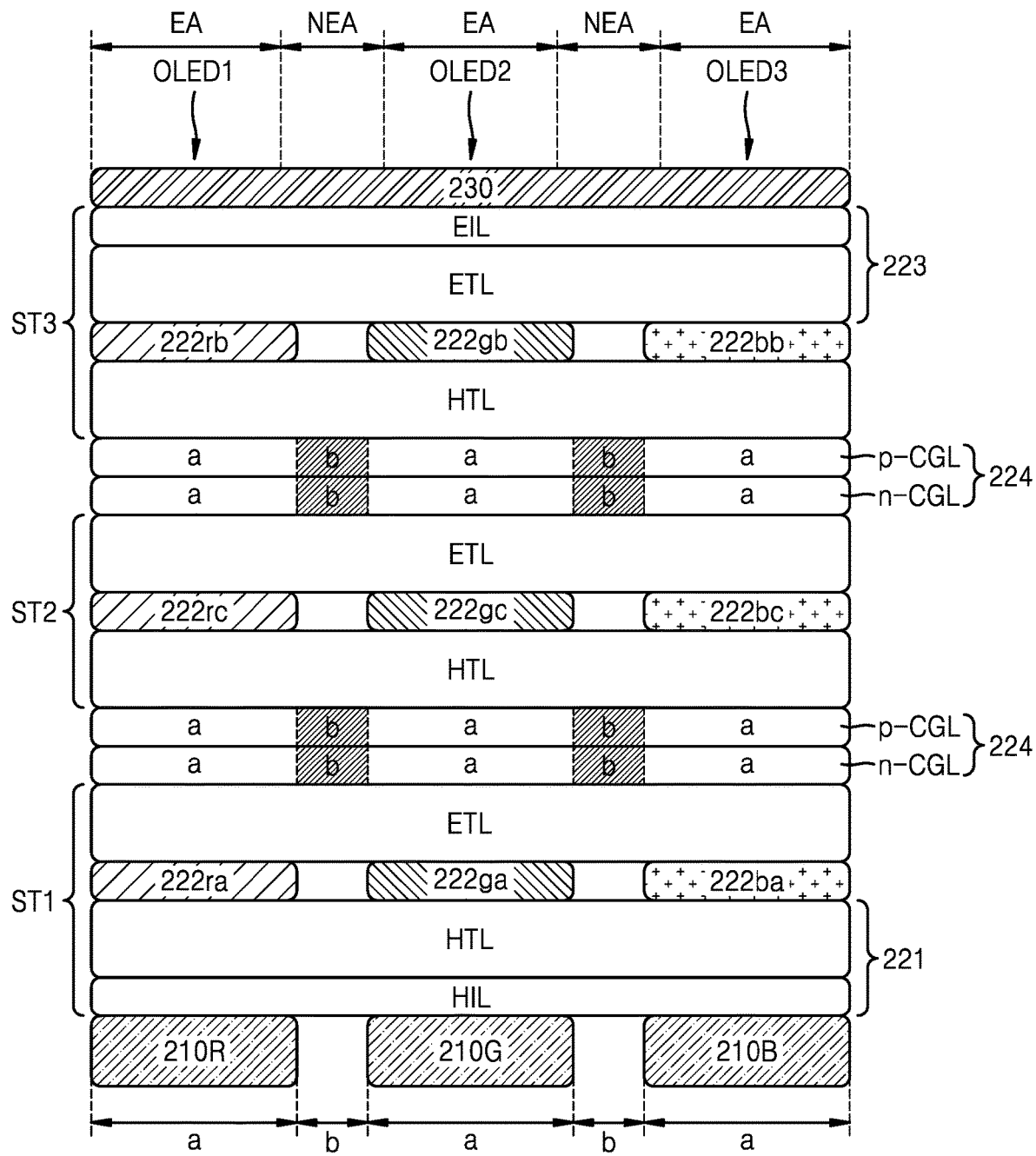
FIG. 11 is a schematic cross-sectional view of first to third organic light-emitting diodes in a display apparatus according to an embodiment.

FIG. 10 is a schematic cross-sectional view of a portion of a display apparatus according to another embodiment. FIG. 11 is a schematic cross-sectional view of the first to third organic light-emitting diodes OLED1, OLED2, and OLED3 in the display apparatus according to an embodiment.

The first to third organic light-emitting diodes OLED1, OLED2, and OLED3 of FIGS. 10 and 11 may be different from those of the above-described embodiments in that each of the first to third organic light-emitting diodes OLED1, OLED2, and OLED3 includes three stacks ST1, ST2, and ST3, each including three emission layers.

Referring to FIGS. 10 and 11, each of the first to third organic light-emitting diodes OLED1, OLED2, and OLED3 may have a tandem structure including a plurality of emission layers.

In an embodiment, each of the first to third intermediate layers 220R, 220G, and 220B may include a plurality of emission layers in one corresponding organic light-emitting diode. In other words, the first to third intermediate layers 220R, 220G, and 220B may include the first to third lower emission layers 222ra, 222ga, and 222ba, first to third intermediate emission layers 222rc, 222gc, and 222bc, and the first to third upper emission layers 222rb, 222gb, and 222bb, respectively, which are arranged to overlap with one another. The first to third lower emission layers 222ra, 222ga, and 222ba, the first to third intermediate emission layers 222rc, 222gc, and 222bc, and the first to third upper emission layers 222rb, 222gb, and 222bb may be individually provided by being patterned for the first to third organic light-emitting diodes OLED1, OLED2, and OLED3, respectively.

Each of the first to third organic light-emitting diodes OLED1, OLED2, and OLED3 may emit light in one of red, green, blue, and/or white colors. To implement such a light emission, each of the first to third lower emission layers 222ra, 222ga, and 222ba, the first to third intermediate emission layers 222rc, 222gc, and 222bc, and the first to third upper emission layers 222rb, 222gb, and 222bb may emit light in red, green, or blue. For example, the first lower emission layer 222ra, the first intermediate emission layer 222rc, and the first upper emission layer 222rb of the first organic light-emitting diode OLED1, which are arranged to overlap with one another, may emit light of the same or substantially the same wavelength as each other, or at least some layers thereof may emit light of different wavelengths from one another. Furthermore, the second lower emission layer 222ga, the second intermediate emission layer 222gc, and the second upper emission layer 222gb of the second organic light-emitting diode OLED2 may emit light of the same or substantially the same wavelength as each other, or at least some layers thereof may emit light of different wavelengths from one another. Furthermore, the third lower emission layer 222ba, the third intermediate emission layer 222bc, and the third upper emission layer 222bb of the third organic light-emitting diode OLED3 may emit light of the same or substantially the same wavelength as each other, or at least some layers thereof may emit light of different wavelengths from one another.

In another embodiment, all of the first to third organic light-emitting diodes OLED1, OLED2, and OLED3 may emit blue light. In this case, all of the first to third lower emission layers 222ra, 222ga, and 222ba, the first to third intermediate emission layers 222rc, 222gc, and 222bc, and the first to third upper emission layers 222rb, 222gb, and 222bb may emit blue light.

In another embodiment, all of the first to third organic light-emitting diodes OLED1, OLED2, and OLED3 may emit white light. In this case, all of the first lower emission layer 222ra, the first intermediate emission layer 222rc, and the first upper emission layer 222rb of the first organic light-emitting diode OLED1 may emit light of different wavelengths from each other. Similarly, all of the second lower emission layer 222ga, the second intermediate emission layer 222gc, and the second upper emission layer 222gb of the second organic light-emitting diode OLED2 may emit light of different wavelengths from each other, and all of the third lower emission layer 222ba, the third intermediate emission layer 222bc, and the third upper emission layer 222bb of the third organic light-emitting diode OLED3 may emit light of different wavelengths from each other.

Figure 12:
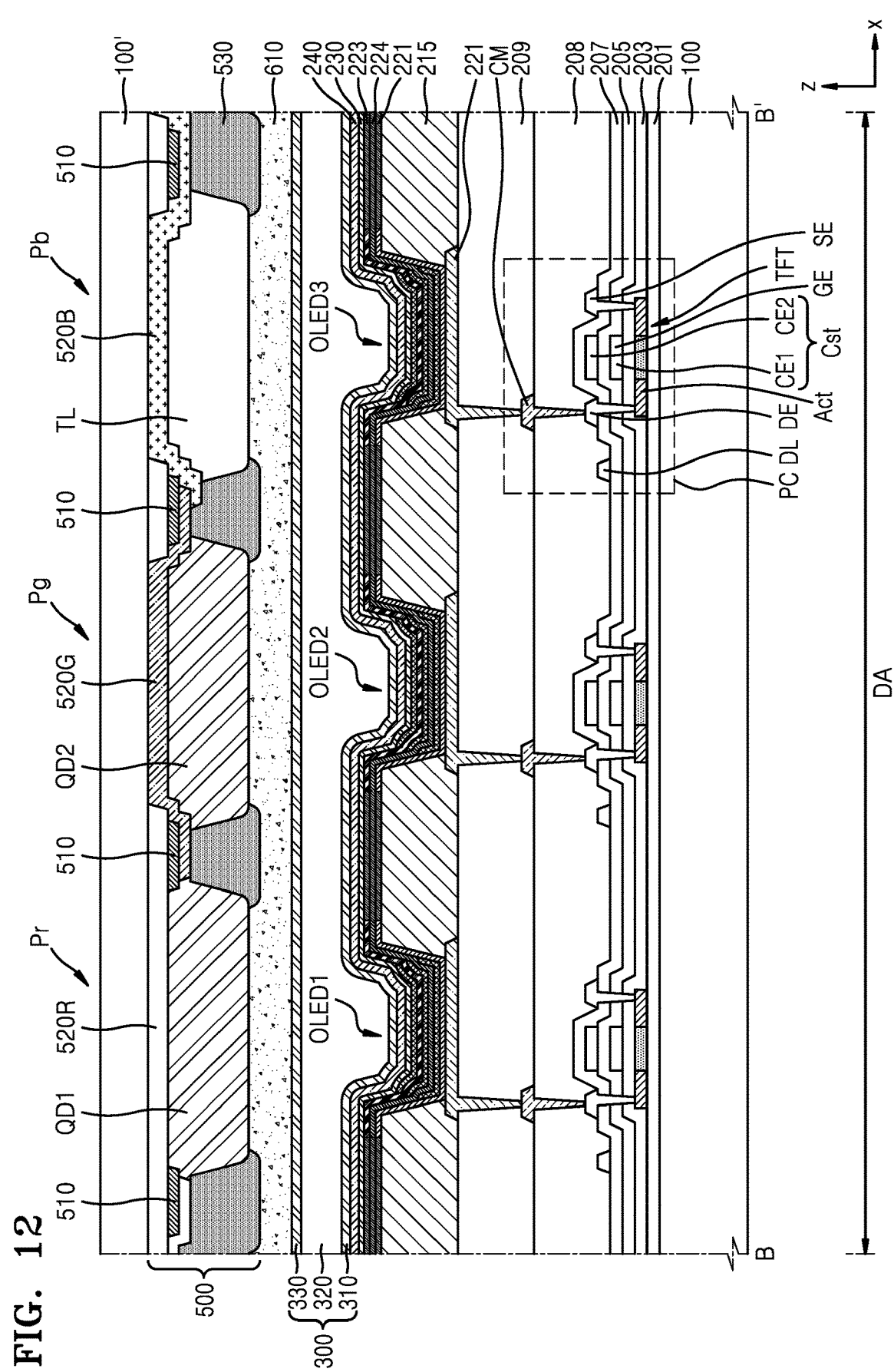
FIG. 12 is a schematic cross-sectional view of a portion of a display apparatus according to another embodiment.

As described above, when the first to third organic light-emitting diodes OLED1, OLED2, and OLED3 emit blue light or white light, the display apparatus may further include the antireflective layer 500 as shown in FIG. 12. When the first to third organic light-emitting diodes OLED1, OLED2, and OLED3 emit red, green, and blue lights, respectively, the antireflective layer 500 may also be provided.

As illustrated in FIGS. 10 and 11, the charge generation layer 224 may be provided between the first to third lower emission layers 222ra, 222ga, and 222ba and the first to third intermediate emission layers 222rc, 222gc, and 222bc, and between the first to third intermediate emission layers 222rc, 222gc, and 222bc and the first to third upper emission layers 222rb, 222gb, and 222bb. In FIG. 10, similarly to FIG. 8, the charge generation layer 224 includes the first part a corresponding to the light-emitting area EA, and the second part b corresponding to the non-light-emitting area NEA. In another embodiment, similarly to FIG. 9, the second part b in which an organic material is degraded may be provided not only in the charge generation layer 224, but also in the hole injection layer HIL, the hole transport layer HTL, the electron transport layer ETL, and the electron injection layer EIL, which are commonly provided across the first to third organic light-emitting diodes OLED1, OLED2, and OLED3.

FIG. 12 is a schematic cross-sectional view of a portion of a display apparatus according to another embodiment.

In FIG. 12, the structures of the first to third organic light-emitting diodes OLED1, OLED2, and OLED3 and the pixel circuits PC thereunder may be the same or substantially the same as those of FIGS. 5 and 11 described above, and thus, redundant description thereof may not be repeated. Accordingly, hereinafter, the differences in the upper structure of the first to third organic light-emitting diodes OLED1, OLED2, and OLED3 may be mainly described in more detail.

Referring to FIG. 12, as the first to third organic light-emitting diodes OLED1, OLED2, and OLED3 may be easily damage by external moisture, oxygen, and/or the like, the first to third organic light-emitting diodes OLED1, OLED2, and OLED3 may be protected by being covered by the thin film encapsulation layer 300. The thin film encapsulation layer 300 may cover the display area DA, and may extend to the outside of the display area DA. The thin film encapsulation layer 300 may include at least one organic encapsulation layer and at least one inorganic encapsulation layer. For example, the thin film encapsulation layer 300 may include a first inorganic encapsulation layer 310, an organic encapsulation layer 320, and a second inorganic encapsulation layer 330.

The first inorganic encapsulation layer 310 may cover the counter electrode 230, and may include a silicon oxide, a silicon nitride, a silicon oxynitride, and/or the like. In some embodiments, other suitable layers, for example, such as a capping layer 240 and/or the like, may be further provided between the first inorganic encapsulation layer 310 and the counter electrode 230. The first inorganic encapsulation layer 310 may be formed along a structure thereunder, so as to have an uneven upper surface. The organic encapsulation layer 320 may cover the first inorganic encapsulation layer 310, and may have an upper surface that is flat or substantially flat (e.g., that is approximately flat), unlike that of the first inorganic encapsulation layer 310. In more detail, the organic encapsulation layer 320 may have the flat or substantially flat (e.g., the approximately flat) upper surface at (e.g., in or on) a portion corresponding to the display area DA. The organic encapsulation layer 320 may include one or more materials selected from the group consisting of polyethylene terephthalate, polyethylene naphthalate, polycarbonate, polyimide, polyethylene sulfonate, polyoxymethylene, polyarylate, hexamethyldisiloxane, and acrylic resin (for example, such as polymethyl methacrylate, polyacryl acid, and the like). The second inorganic encapsulation layer 330 may cover the organic encapsulation layer 320, and may include a silicon oxide, a silicon nitride, a silicon oxynitride, and/or the like.

Even when cracks are generated in the thin film encapsulation layer 300 through the above-described multilayered structure, the thin film encapsulation layer 300 may prevent or substantially prevent the cracks from being connected between the first inorganic encapsulation layer 310 and the organic encapsulation layer 320, or between the organic encapsulation layer 320 and the second inorganic encapsulation layer 330. Accordingly, the formation of a path through which the external moisture, oxygen, and/or the like infiltrates into the display area DA may be prevented or reduced.

A filler 610 may be disposed on the thin film encapsulation layer 300. The filler 610 may perform a buffering function with respect to an external pressure and/or the like. The filler 610 may include an organic material, such as methyl silicone, phenyl silicone, polyimide, and/or the like. However, the present disclosure is not limited thereto, and the filler 610 may include an organic sealant, such as a urethane-based resin, an epoxy-based resin, and/or an acrylic resin, or an inorganic sealant, such as silicon and/or the like.

The antireflective layer 500 may be provided on an upper substrate 100' disposed to face the substrate 100 with the filler 610 therebetween. The antireflective layer 500 may include a black matrix 510, a color filter 520, color conversion layers QD1 and QD2, a transmissive layer TL, and a partition 530.

Each of the color conversion layers QD1 and QD2 may include quantum dots. Quantum dots may have intrinsic excitation and emission properties according to the materials and sizes thereof, and accordingly, may convert incident light to a desired color light (e.g., a predetermined or a certain color light). Various suitable materials may be used as the quantum dots.

In an embodiment, the quantum dots may have a core-shell structure including a core including a nano crystal and a shell surrounding (e.g., around a periphery of) the core. The core of a quantum dot may be selected from among group II-VI compounds, group III-V compounds, group IV-VI compounds, group IV components, group IV compounds, and/or a combination thereof.

The group II-VI compounds may be selected from the group consisting of a two-element compound selected from the group consisting of CdSe, CdTe, ZnS, ZnSe, ZnTe, ZnO, HgS, HgSe, HgTe, MgSe, MgS, and a mixture thereof; a three-element compound selected from the group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-V compound may be selected from the group consisting of a two-element compound selected from the group consisting of GaN, GaP, GaAs, GaSb, AlN, AlP, AlAs, AlSb, InN, InP, InAs, InSb, and a mixture thereof; a three-element compound selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, and a mixture thereof; and a four-element compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, GaAlNP, and a mixture thereof.

The group IV-VI compound may be selected from the group consisting of a two-element compound selected from the group consisting of SnS, SnSe, SnTe, PbS, PbSe, PbTe, and a mixture thereof; a three-element compound selected from the group consisting of SnSeS, SnSeTe, SnSTe, PbSeS, PbSeTe, PbSTe, SnPbS, SnPbSe, SnPbTe, and a mixture thereof; and a four-element compound selected from the group consisting of SnPbSSe, SnPbSeTe, SnPbSTe, and a mixture thereof. The group IV element may be selected from the group consisting of Si, Ge, and a mixture thereof. The group IV compound may include a two-element compound selected from the group consisting of SiC, SiGe, and a mixture thereof.

In this case, a two-element compound, a three-element compound, or a four-element compound may be present in particles at a uniform concentration, or may present in the same particle by being divided into states in which a concentration distribution is partially different. Also, the quantum dot may have a core/shell structure in which one quantum dot surrounds (e.g., around a periphery of) another quantum dot. An interface between a core and a shell may have a concentration gradient in which a concentration of elements present in the shell decreases toward the center thereof.

The shell of a quantum dot may function as a protection layer for maintaining or substantially maintaining semiconductor characteristics by preventing or reducing a chemical degeneration of the core, and/or a charging layer for providing electrophoretic characteristics to a quantum dot. The shell may be a single layer or multiple layers. Examples of the shell of a quantum dot may include a metal or a non-metal oxide, a semiconductor compound, a combination thereof, or the like.

Some examples of the metal or non-metal oxide may include a two-element compound, such as SiO, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and/or the like, or a three-element compound, such as $MgAl_2O_4$, $CoFe_2O_4$, $NiFe_2O_4$, $CoMn_2O_4$, and/or the like, but the present disclosure is not limited thereto.

Also, some examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and/or the like, but the present disclosure is not limited thereto.

A quantum dot may have a full width at half maximum (FWHM) of an emission wavelength spectrum of about 45 nm or less, particularly about 40 nm or less or about 30 nm or less, in which color purity or color reproducibility may be improved. Furthermore, light through the quantum dots may be emitted in all directions, thereby improving light viewing angles and increasing a viewing angle.

Furthermore, the shape of a quantum dot is not particularly limited, and a generally used shape, for example, a shape of a sphere, a pyramid, a multi-arm, or cubic nano particles, nano tubes, nano wires, nano fibers, nano plate-shaped particles, and/or the like, may be employed therefor.

A quantum dot may control the color of emitted light according to the size of a particle. Accordingly, the quantum dot may have various emission colors of blue, red, green, and/or the like.

The core of a quantum dot may have a diameter of about 2-10 nm. When a quantum dot is exposed to light, the quantum dot may emit light of a frequency (e.g., a predetermined or specific frequency) according to the size of a particle, the type of a material, and the like. The average size of quantum dots included in the first color conversion layer QD1 and the average size of quantum dots included in the second color conversion layer QD2 may be different from each other. For example, as the size of a quantum dot increases, a color light having a longer wavelength may be emitted. Accordingly, the size of a quantum dot may be selected to be suitable for colors of the first pixel Pr and the second pixel Pg.

The first and second color conversion layers QD1 and QD2 may further include various suitable materials, in addition to quantum dots, to appropriately mix and disperse the quantum dots. For example, scattering particles, a solvent, a photoinitiator, a binder polymer, a dispersant, and/or the like may be further included.

A transmission window TW (e.g., corresponding to the transmissive layer TL) may be disposed at (e.g., in or on) the light-emitting area EA of the third pixel Pb, to which no color conversion layer corresponds. The transmission window TW may include an organic material, so that light may be emitted from the third organic light-emitting diode OLED3 of the third pixel Pb without converting a wavelength of the emitted light. The transmission window TW may include scattering particles for uniform color spreadability. In this case, each of the scattering particles may have a diameter of about 200 nm to 400 nm.

In the present embodiment, the first organic light-emitting diode OLED1 and the second organic light-emitting diode OLED2 included in the first pixel Pr and the second pixel Pg, respectively, may emit light of the same or substantially the same wavelength as each other, and the colors of the first pixel Pr and the second pixel Pg may be determined by the colors of light emitted by the quantum dots of the first color conversion layer QD1 and the quantum dots of the second color conversion layer QD2.

As no color conversion layer is provided at (e.g., corresponding to) the light-emitting area EA of the third pixel Pb, the color of the third pixel Pb may be determined by the color of light emitted by the third organic light-emitting diode OLED3. For example, the first pixel Pr, the second pixel Pg, and the third pixel Pb may implement red, green, and blue colored lights, respectively.

The partition 530 may be disposed between the first color conversion layer QD1, the second color conversion layer QD2, and the transmissive layer TL, to correspond to the non-light-emitting area NEA. In more detail, the partition 530 may be disposed between the first color conversion layer QD1 and the second color conversion layer QD2, between the second color conversion layer QD2 and the transmissive layer TL, and the like.

The partition 530 may include an organic material, and a material such as Cr, CrOx, Cr/CrOx, Cr/CrOx/CrNy, a resin (a carbon pigment or a RGB mixed pigment), graphite, a non-Cr-based material, and/or the like, as a material to adjust an optical density. As another example, the partition 530 may include a pigment for a color of red, green, yellow, and the like. The partition 530 may serve as a black matrix to prevent or substantially prevent color mixing, and to improve visibility.

First to third color filters 520R, 520G, and 520B and the black matrix 510 may be provided between the upper substrate 100', the first and second color conversion layers QD1 and QD2, and the transmissive layer TL.

The first to third color filters 520R, 520G, and 520B may be introduced to implement a full color image, improve color purity, and improve outdoor visibility. The first to third color filters 520R, 520G, and 520B may absorb stray light, or in other words, lower light that is not color-converted by the quantum dots, passing through the first and second color conversion layers QD1 and QD2, without changing a wavelength in the first and second color conversion layers QD1 and QD2, and may transmit only light of a desired wavelength. For example, light passing through the first color filter 520R may be red light, light passing through the second color filter 520G may be green light, and light passing through the third color filter 520B may be blue light.

The black matrix 510 may be disposed between the first to third color filters 520R, 520G, and 520B to correspond to the non-light-emitting area NEA. The black matrix 510 may be a member for improving color sharpness and contrast. The black matrix 510 may include at least one of a black pigment, a black dye, or black particles. In some embodiments, the black matrix 510 may include a suitable material, such as Cr, CrOx, Cr/CrOx, Cr/CrOx/CrNy, a resin (a carbon pigment or a RGB mixed pigment), graphite, a non-Cr-based material, and/or the like.

From among the first to third color filters 520R, 520G, and 520B, the color filters that are arranged adjacent to each other may overlap with each other at (e.g., in or on) the non-light-emitting area NEA. As color filters of different colors are provide to overlap with each other, a light shielding rate may be improved. However, the present disclosure is not limited thereto, and color filter 520 and/or the black matrix 510 may be omitted as needed or desired.

Although the display apparatus is mainly described in more detail above, the present disclosure is not limited thereto. For example, some embodiments of the present disclosure may be directed to methods of manufacturing the display apparatus.

Figure 13:
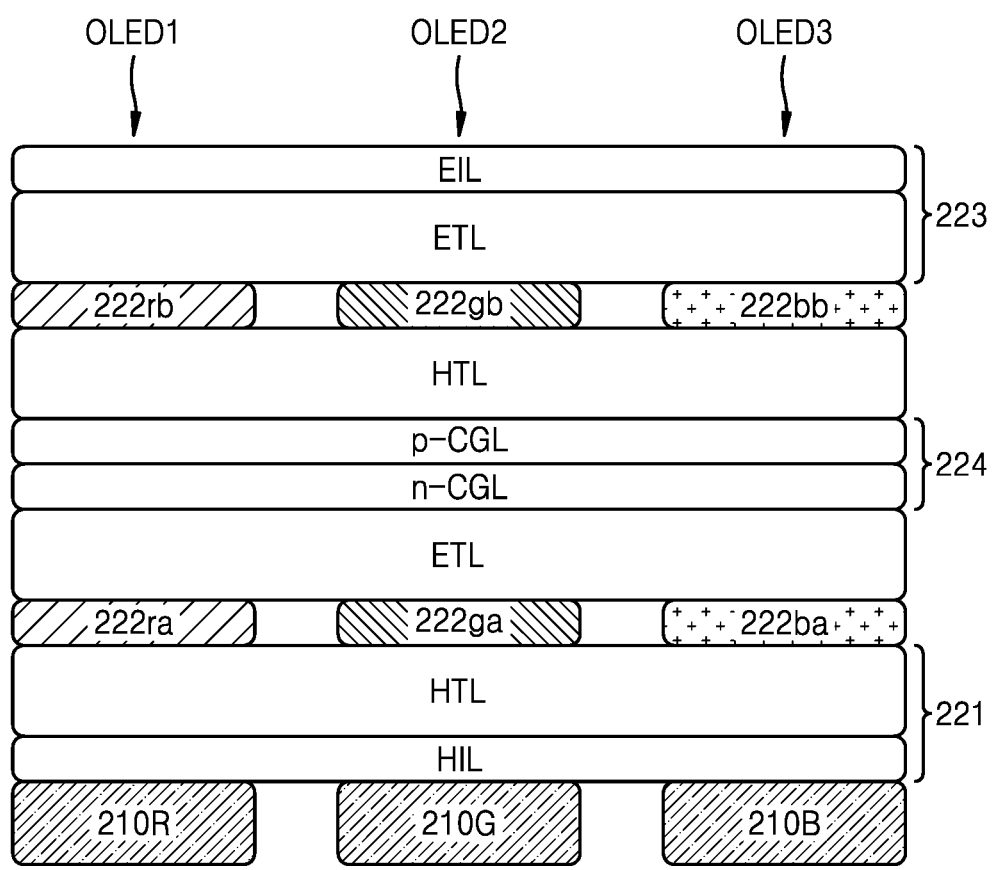
FIGS. 13-15 are cross-sectional views of a method of manufacturing a display apparatus according to an embodiment.
Figure 14:
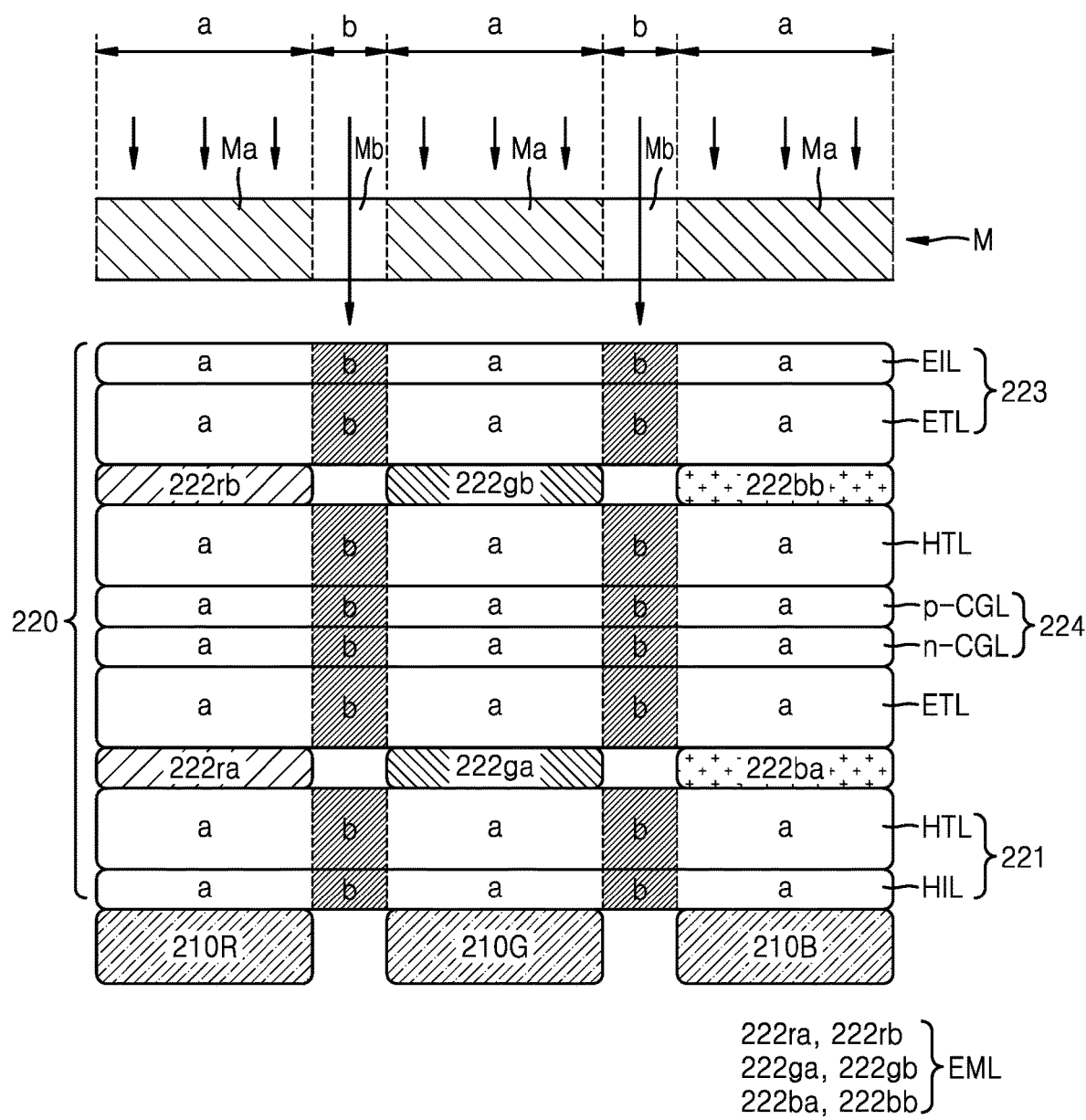
Figure 15:
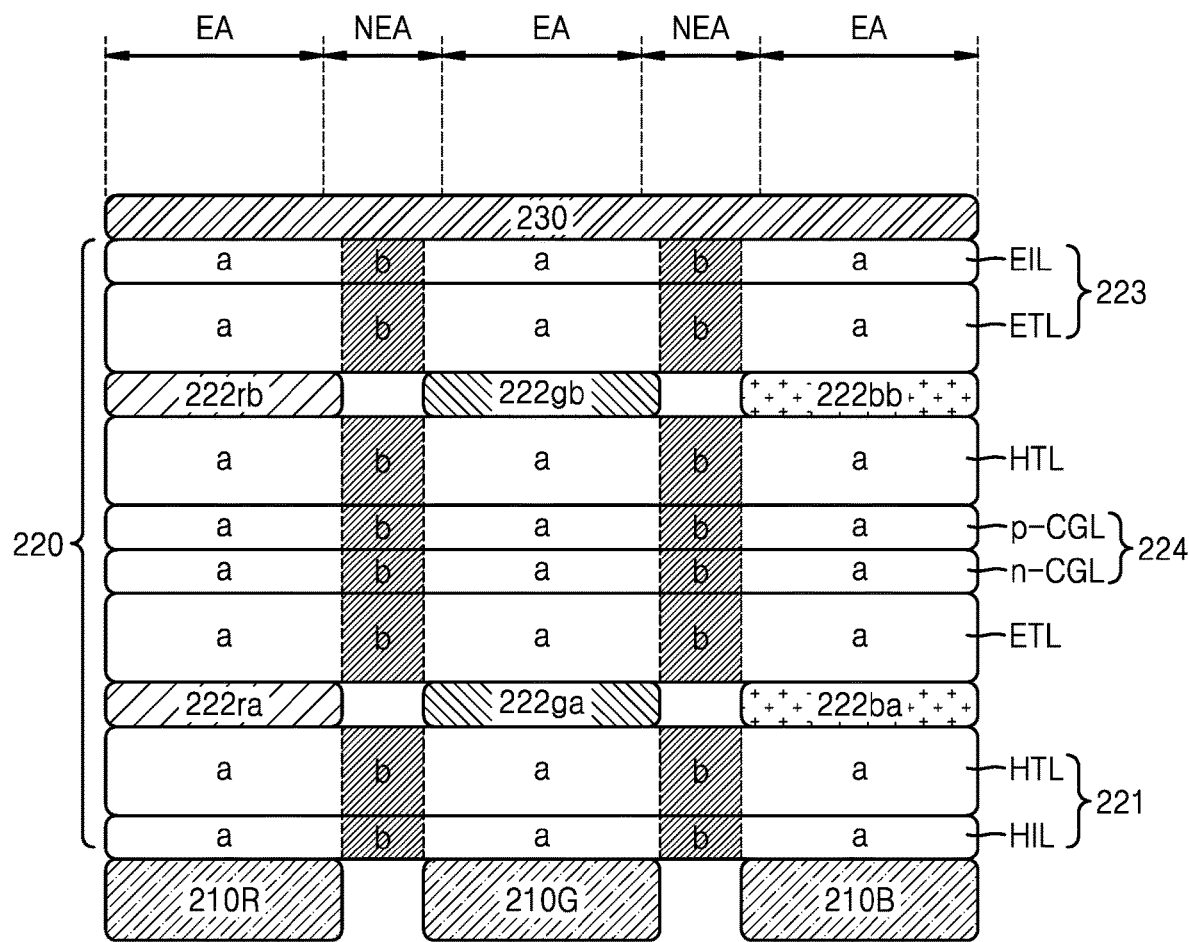
Figure 16:
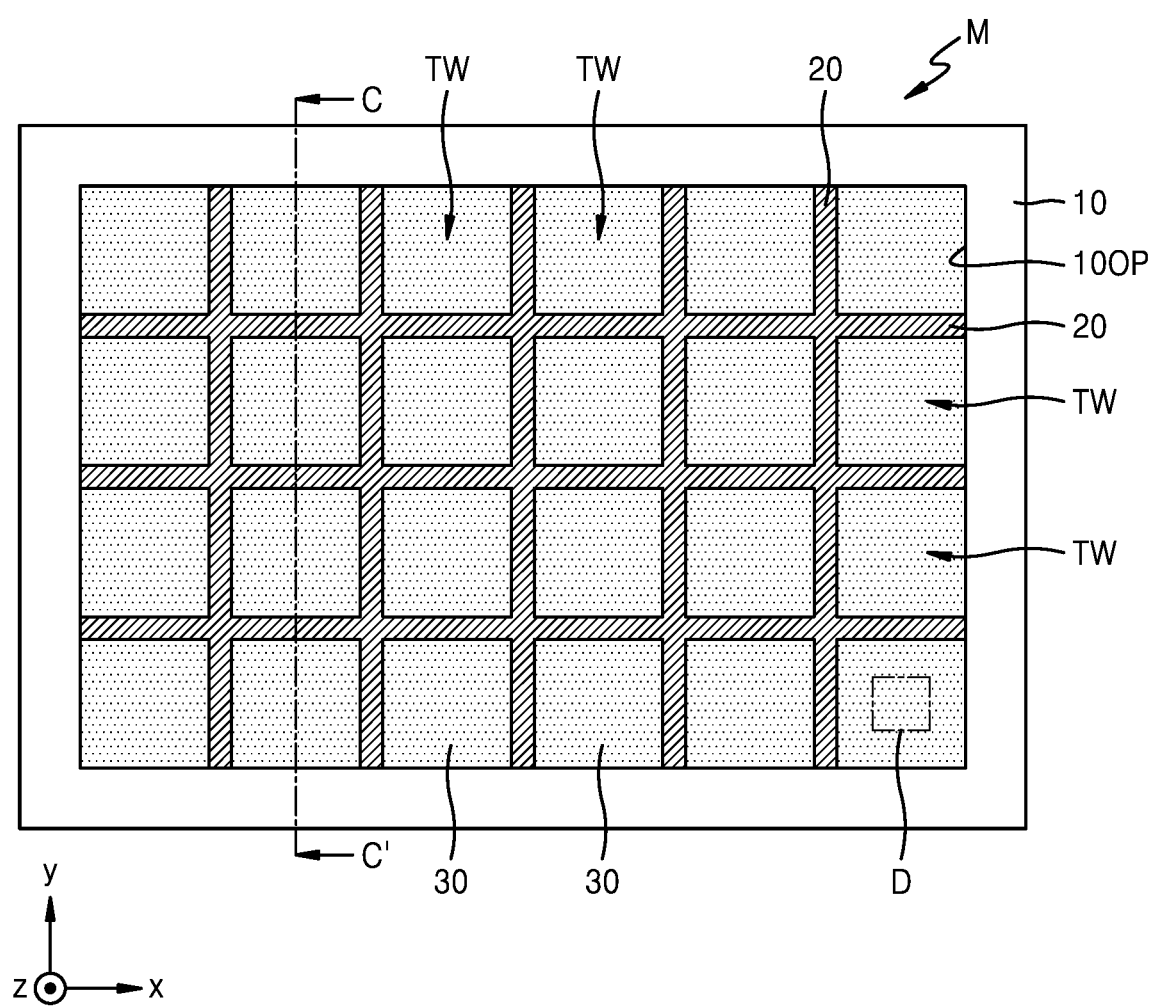
FIGS. 16-19 are schematic plan views and cross-sectional views of a photomask used for a method of manufacturing a display apparatus according to an embodiment.

FIGS. 13 to 15 are cross-sectional views of a method of manufacturing a display apparatus according to an embodiment.

In more detail, FIGS. 13 to 15 illustrate a method of forming the first to third organic light-emitting diodes OLED1, OLED2, and OLED3 of the embodiment described above with reference to FIG. 9. In the following description, a manufacturing process is mainly described in more detail, and a material used for forming each layer, a detailed structure thereof, and the like are the same or substantially the same as those described above with reference to FIGS. 8 and 9, and thus, redundant description thereof may not be repeated.

Referring to FIG. 13, the first to third pixel electrodes 210R, 210G, and 210B may be formed on the second organic insulating layer 209 by being patterned for the pixels. As illustrated in FIG. 7, the pixel definition layer 215 having an opening may be formed on the first to third pixel electrodes 210R, 210G, and 210B.

The first common layer 221 including the hole injection layer HIL and the hole transport layer HTL, the charge generation layer 224 including the first to third lower emission layers 222*ra*, 222*ga*, and 222*ba*, the electron transport layer ETL, the n-type charge generation layer n-CGL, the p-type charge generation layer p-CGL, and the second common layer 223 including the hole transport layer HTL, the first to third upper emission layers 222*rb*, 222*gb*, and 222*bb*, the electron transport layer ETL, and the electron injection layer EIL, may be sequentially stacked on the first to third pixel electrodes 210R, 210G, and 210B.

In this case, the hole injection layer HIL, the hole transport layer HTL, the electron transport layer ETL, the electron injection layer EIL, and the charge generation layer 224 may be integrally provided across the first to third organic light-emitting diodes OLED1, OLED2, and OLED3. The hole injection layer HIL, the hole transport layer HTL, the electron transport layer ETL, the electron injection layer EIL, and the charge generation layer 224 may be commonly deposited corresponding to the entire area of the display area DA by using an open mask. The first to third lower emission layers 222*ra*, 222*ga*, and 222*ba* and the first to third upper emission layers 222*rb*, 222*gb*, and 222*bb* may be provided by being patterned for the pixels. The first to third lower emission layers 222*ra*, 222*ga*, and 222*ba* and the first to third upper emission layers 222*rb*, 222*gb*, and 222*bb* may be formed in a fast multipole method (FMM), an inkjet method, and/or the like.

Referring to FIG. 14, after the first to third intermediate layers 222R, 222G, and 222B are formed on the first to third pixel electrodes 210R, 210G, and 210B as illustrated in FIG. 13, light may be irradiated to a partial area of the first to third intermediate layers 222R, 222G, and 222B by using a photomask M. The photomask M is provided to be used for a method of manufacturing the display apparatus according to an embodiment of the present disclosure, and is described in more detail below with respect to FIGS. 16 to 19.

The photomask M may include a first area Ma corresponding to the light-emitting area EA, and a second area Mb corresponding to the non-light-emitting area NEA. The width of the first area Ma may be greater than the width of the light-emitting area EA. In an embodiment, the width of the first area Ma may be equal to or substantially equal to or slightly greater than the width of the pixel electrode 210. When the width of the first area Ma is the same or substantially the same as that of the light-emitting area EA, part of an emission layer EML may be damaged by the light passing through the second area Mb and irradiated to an intermediate layer 220.

The second area Mb may be provided as a transmission area, so that light may be irradiated to the non-light-emitting area NEA. The light irradiated toward the intermediate layer 220 with the photomask M therebetween may penetrate the second area Mb to be irradiated to part of the intermediate layer 220. The light corresponding to the first area Ma may be blocked, and accordingly, no light is irradiate to the light-emitting area EA. For example, high energy of a broad wavelength such as infrared, ultraviolet, IPL, and the like, short wavelength energy like laser, and the like may be used as the light. The kind of a light source is not limited thereto, and any suitable light source capable of degrading an organic material of the intermediate layer 220 by heat may be used.

As such, by the light penetrating the second area Mb and irradiated to the intermediate layer 220, the intermediate layer 220 may include at least a partially degraded area, or in other words, the second part b at (e.g., in or on) the non-light-emitting area NEA. As the degraded area is provided to correspond to the non-light-emitting area NEA, the emission layer EML may not have a degraded area. In other words, the degraded area may be provided at (e.g., in or on) the hole injection layer HIL, the hole transport layer HTL, the electron transport layer ETL, the electron injection layer EIL, and the charge generation layer 224, which are integrally provided across the first to third organic light-emitting diodes OLED1, OLED2, and OLED3.

In more detail, the charge generation layer 224 may include the first part a corresponding to each pixel electrode 210, and the second part b corresponding to an area between the pixel electrodes 210. In other words, the first part a of the charge generation layer 224 may correspond to the light-emitting area EA, and the second part b may correspond to the non-light-emitting area NEA. In the charge generation layer 224, an area other than the second part b corresponding to at least part of the non-light-emitting area NEA may be the first part a. In other words, a portion of the first part a may be at (e.g., in or on) the non-light-emitting area NEA.

The charge generation layer 224 may have a remarkably higher electrical conductivity compared to the first and second common layers 221 and 223. Accordingly, in an embodiment, a leakage current to an adjacent pixel may be prevented or substantially prevented through the second part b of the charge generation layer 224.

In the charge generation layer 224 that is integrally formed, the electrical conductivity of the first part a may be different from the electrical conductivity of the second part b. In an example, the electrical conductivity of the first part a may be greater than the electrical conductivity of the second part b. The electrical conductivity of the first part a may be about 10 times to about 30 times greater than the electrical conductivity of the second part b.

Such a difference in electrical conductivity may be implemented by degrading the second part b of the charge generation layer 224 that is integrally formed. In other words, the performance of a part of the charge generation layer 224 including an organic material may be lowered by irradiating light corresponding to the second part b of the charge generation layer 224. As the second part b has an electrical conductivity that is remarkably less than that of the first part a, a flow of a current is formed only in a vertical direction through the first part a, and the flow of a current in a horizontal direction may be prevented or reduced by the second part b. In other words, no leakage current may be generated by the second part b, and an effect of being short-circuited may be implemented.

Thus, according to one or more embodiments of the present disclosure, as the electrical conductivity properties of the second part b of the charge generation layer 224 corresponding to the light-emitting area EA and the non-light-emitting area NEA of each of the pixels Pr, Pg, and Pb are lowered, the light emission of an adjacent pixel due to a leakage current may be effectively prevented (e.g., prevented or substantially prevented), and thus, the display quality of the display apparatus may be improved.

Although FIG. 14 illustrates that the intermediate layer 220, except the emission layer EML, all includes the second part b that is degraded, the disclosure is not limited thereto. It may be sufficient that the second part b that is degraded is included only in the charge generation layer 224, and the second part b that is degraded may not be formed in the first and second common layers 221 and 223, except for the charge generation layer 224. In more detail, the first common layer 221 that is adjacent to the pixel circuit PC shown in FIG. 5 thereunder may not include the second part b that is degraded, which is to prevent or substantially prevent the pixel circuit PC shown in FIG. 5 thereunder from being damaged by heat energy.

Accordingly, by controlling process conditions such as a type, a wavelength, and/or the like of the light that is irradiated, heat by the light may not reach the first common layer 221.

As illustrated in FIG. 15, the counter electrode 230 may be formed on the electron injection layer EIL. The counter electrode 230, like the first and second common layers 221 and 223, may be integrally formed across the entire surface of the display area DA.

FIGS. 16 to 19 are schematic plan views and cross-sectional views of a photomask used for a method of manufacturing a display apparatus according to an embodiment.

Referring to FIGS. 16 to 19, the photomask M may include a frame portion 10 forming an outer edge thereof, a rib portion 20, and an organic film portion 30.

An opening 10OP may be provided at the center of the frame portion 10. Although the frame portion 10 is provided in a rectangular or substantially rectangular shape (e.g., an approximately rectangular shape) suitable for the size of a mother substrate, the present disclosure is not limited thereto. The frame portion 10, similar to the open mask, may include a metal material to have a thickness 10t of tens of millimeters to several centimeters. The photomask M may effectively adhere to the mother substrate through the frame portion 10, and thus, a probability that a defect is generated in a manufacturing process because a central portion of the photomask M sags may be remarkably lowered.

The rib portion 20 may be provided to contact the frame portion 10 at one side and the other side thereof across the opening 10OP of the frame portion 10. The rib portion 20 may include a plurality of ribs horizontally and vertically to have a rib shape having a narrow width. The rib portion 20 may be provided with a plurality of transmission windows TW. One of the transmission windows TW may correspond to one cell corresponding to the display apparatus. One of the transmission windows TW may correspond to a display area of one display apparatus.

The rib portion 20 may include a metal material. The rib portion 20 may have a thickness of tens of micrometers to several millimeters, so as to be formed with a very thin thickness compared to the frame portion 10. The rib portion 20 may prevent or substantially prevent the central portion of the photomask M from sagging.

Figure 17:
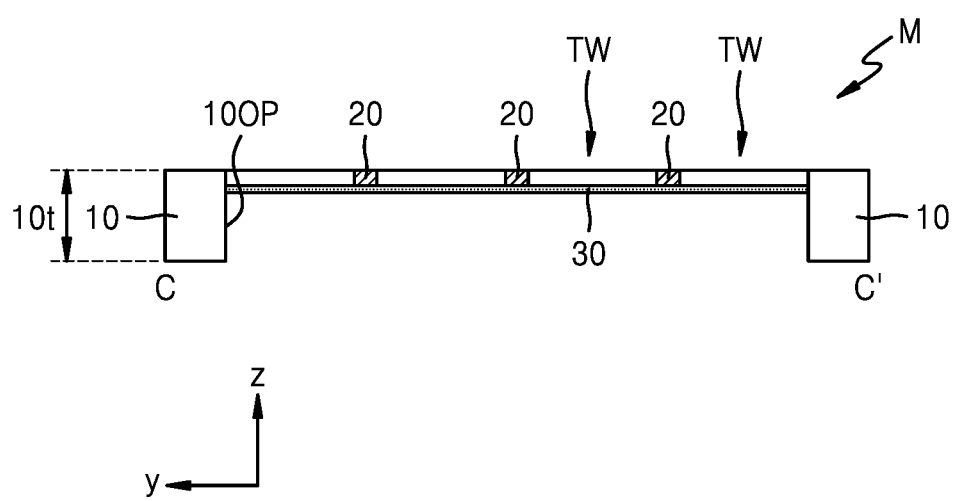

The organic film portion 30 may be disposed to correspond to the opening 10OP of the frame portion 10. The organic film portion 30 may be locate at one surface of the rib portion 20. Part of the organic film portion 30 may overlap with the rib portion 20. FIG. 17 illustrates that the organic film portion 30 is disposed on a lower surface of the rib portion 20.

The organic film portion 30 may include an organic material having light transmissivity. For example, the organic film portion 30 may include polyimide (PI), polyethylene terephthalate (PET), and/or the like. The organic film portion 30 may include a flexible material.

Figure 18:
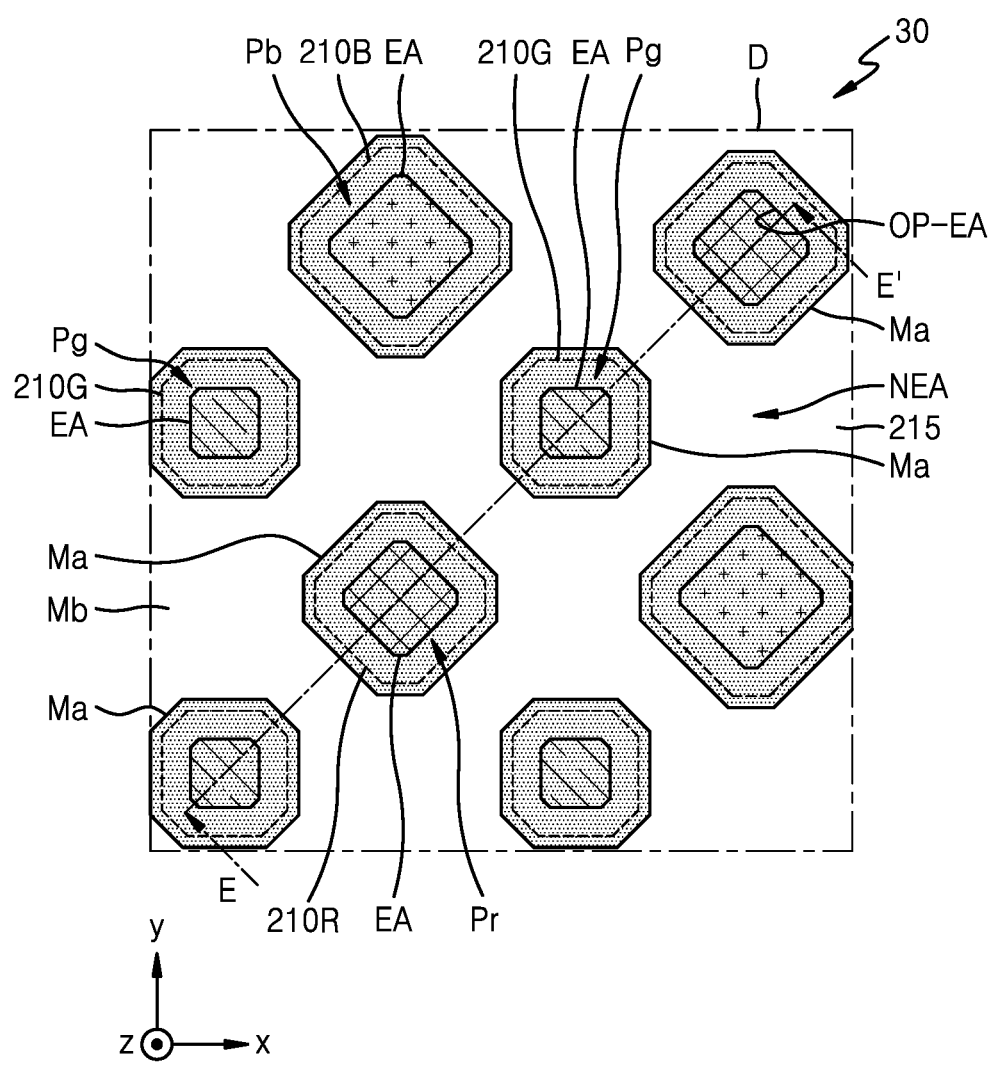
Figure 19:
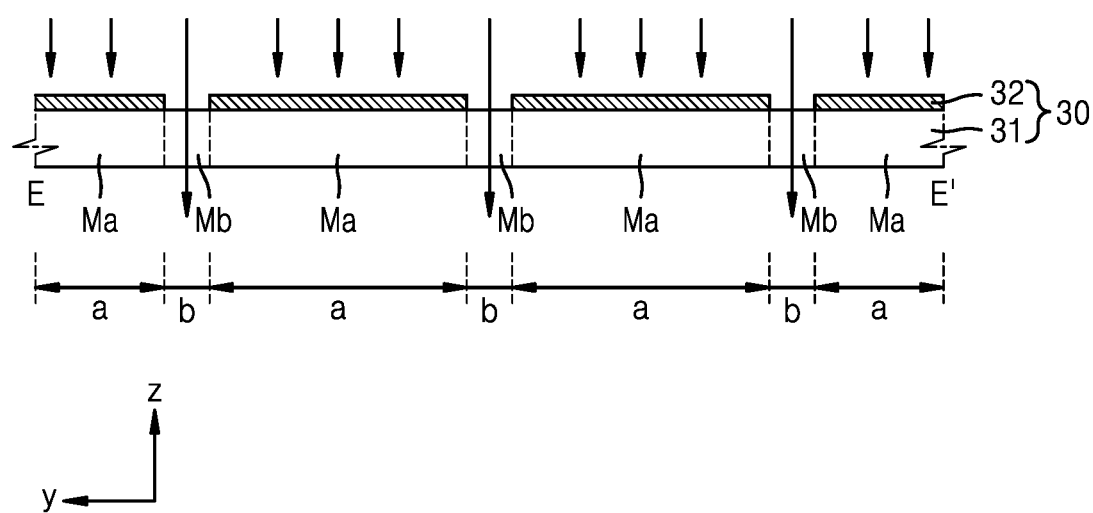

As illustrated in FIGS. 18 and 19, the organic film portion 30 may include the first area Ma corresponding to the light-emitting area EA of a corresponding pixel P, and the second area Mb corresponding to the non-light-emitting area NEA. The first area Ma may correspond to part of the non-light-emitting area NEA. As the first area Ma is a portion where light is blocked, the first area Ma may be implemented to have a size greater than that of the light-emitting area EA. When the first area Ma is the same or substantially the same as the light-emitting area EA, light is irradiated to the emission layer EML shown in FIG. 14 disposed at (e.g., in or on) the light-emitting area EA, so that the emission layer EML may be degraded. Accordingly, the second area Mb corresponding to the non-light-emitting area NEA may be substantially narrower than the non-light-emitting area NEA, and thus, the second area Mb may correspond to an area between the pixel electrodes of the pixels P.

Referring to FIG. 19, the organic film portion 30 may include a film sheet 31 including a flexible material having light transmissivity, and a light shielding layer 32 including a light shielding material applied to at least part of the film sheet 31. The light shielding layer 32 may be applied corresponding to the first area Ma of the organic film portion 30. The light shielding material may include at least one of, for example, a black pigment, a black dye, or black particles. In some embodiments, light shielding material may include Cr, CrOx, Cr/CrOx, Cr/CrOx/CrNy, a resin, carbon pigment, graphite, non-Cr-based material, and/or the like.

According to an embodiment, the light irradiated toward the photomask M may be irradiated to the first area Ma and the second area Mb of the organic film portion 30 corresponding to the transmission window TW. The light may be blocked by the first area Ma of the organic film portion 30, and may not reach the intermediate layer 220, and thus, the first part a may be formed as illustrated in FIG. 9. Furthermore, the light may penetrate the second area Mb of the organic film portion 30 to reach the intermediate layer 220, for example, the charge generation layer 224, thereby forming the second part b that is a degraded area, as illustrated in FIG. 9.

As light is irradiated corresponding to the second part b that is a degraded area of the intermediate layer 220, for example, the charge generation layer 224, the performance of a part of the charge generation layer 224 including an organic material may be lowered. As the electrical conductivity of the second part b is remarkably less than that of the first part a, the flow of a current may be formed only in a vertical direction through the first part a, and the flow of a current in a horizontal direction may be prevented or substantially prevented by the second part b. In other words, no leakage current is generated by the second part b, and an effect of being electrically short-circuited may be implemented.

According to one or more embodiments of the present disclosure, as the electrical conductivity properties of the second part b of the charge generation layer 224 corresponding to the light-emitting area EA and the non-light-emitting area NEA of each of the pixels Pr, Pg, and Pb are lowered, the light emission of an adjacent pixel due to a leakage current may be effectively prevented (e.g., prevented or substantially prevented), and thus, the display quality of the display apparatus may be improved According to one or more of the above-described embodiments, by preventing a leakage current, display apparatuses with improved display quality, masks for manufacturing the display apparatuses, and methods of manufacturing the display apparatuses may be implemented. However, the spirit and scope of the present disclosure are not limited by the aspects and features described above.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various embodiments and is not to be construed as limited to the specific example embodiments disclosed herein, and that various modifications to the disclosed embodiments, as well as other example embodiments, are intended to be included within the spirit and scope of the present disclosure as defined in the appended claims, and their equivalents.

What is claimed is:

1. A display apparatus comprising:
a first pixel electrode of a first pixel;
a second pixel electrode of a second pixel adjacent to the first pixel, the first and second pixels configured to emit light of different colors from each other;
a first lower emission layer on the first pixel electrode;
a second lower emission layer on the second pixel electrode;
a first upper emission layer on the first lower emission layer;
a second upper emission layer on the second lower emission layer;
a charge generation layer between the first lower emission layer and the first upper emission layer, and between the second lower emission layer and the second upper emission layer; and
a counter electrode extending across the first upper emission layer and the second upper emission layer,
wherein the charge generation layer comprises a first part corresponding to each of the first pixel electrode and the second pixel electrode, and a second part corresponding to an area between the first pixel electrode and the second pixel electrode, wherein electrical conductivities of the first part and the second part are different from each other, and wherein the second part of the charge generation layer overlaps with a region where an entirety of the first lower emission layer and an entirety of the second lower emission layer are spaced apart from each other at the area corresponding to the second part of the charge generation layer, and in the region, the second part of the charge generation layer directly contacts a layer extending from underneath the first and second lower emission layers overlapping with the first part of the charge generation layer to the region to overlap with and contact the second part of the charge generation layer.

2. The display apparatus of claim 1, wherein the electrical conductivity of the second part is less than the electrical conductivity of the first part.

3. The display apparatus of claim 2, wherein the electrical conductivity of the first part is about ten times or more greater than the electrical conductivity of the second part.

4. The display apparatus of claim 1, wherein light emitted from between the first pixel electrode and the counter electrode has a first wavelength band, and light emitted from between the second pixel electrode and the counter electrode has a second wavelength band different from the first wavelength band.

5. The display apparatus of claim 1, wherein the first lower emission layer and the first upper emission layer are configured to emit light of the same wavelength band as each other.

6. The display apparatus of claim 1, wherein the first lower emission layer and the first upper emission layer are configured to emit light of different wavelength bands from each other.

7. The display apparatus of claim 1, wherein the second lower emission layer and the second upper emission layer are configured to emit light of the same wavelength band as each other.

8. The display apparatus of claim 1, wherein the second lower emission layer and the second upper emission layer are configured to emit light of different wavelength bands from each other.

9. A display apparatus comprising:
a first pixel;
a second pixel adjacent to the first pixel, and configured to emit light of a different color from that of the first pixel;
a first organic light-emitting diode corresponding to the first pixel;
a second organic light-emitting diode corresponding to the second pixel;
a first emission layer in the first organic light-emitting diode;
a second emission layer in the second organic light-emitting diode; and
a common layer underneath the first and second emission layers and commonly extending across the first organic light-emitting diode and the second organic light-emitting diode,
wherein the common layer comprises a first part corresponding to the first emission layer and the second emission layer, and a second part corresponding to an area between the first emission layer and the second emission layer,
wherein an electrical conductivity of the second part is less than an electrical conductivity of the first part, and
wherein the second part of the common layer overlaps with a region where an entirety of the first emission layer and an entirety of the second emission layer are spaced apart from each other at the area corresponding to the second part of the common layer, and in the region, the second part of the common layer directly contacts a layer extending from above the first and second emission layers overlapping with the first part of the common layer to the region to overlap with and contact the second part of the common layer.

* * * * *